United States Patent
Ogawa et al.

(10) Patent No.: US 6,925,628 B2
(45) Date of Patent: Aug. 2, 2005

(54) HIGH-LEVEL SYNTHESIS METHOD

(75) Inventors: Osamu Ogawa, Neyagawa (JP); Dai Hattori, Otsu (JP); Keiichi Kurokawa, Takarazuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/690,957

(22) Filed: Oct. 21, 2003

(65) Prior Publication Data

US 2004/0083443 A1 Apr. 29, 2004

(30) Foreign Application Priority Data

Oct. 22, 2002 (JP) ........................................ 2002-307570

(51) Int. Cl.[7] .............................................. G06F 17/50
(52) U.S. Cl. .............................................. 716/18; 716/2
(58) Field of Search .......................... 716/1–18; 703/14, 703/15

(56) References Cited

U.S. PATENT DOCUMENTS

| | | | | |
|---|---|---|---|---|
| 6,360,355 | B1 | * | 3/2002 | Nishida et al. ............... 716/18 |
| 6,438,739 | B1 | * | 8/2002 | Yamada ........................ 716/18 |
| 6,449,763 | B1 | * | 9/2002 | Yamada et al. ............... 716/18 |
| 6,604,232 | B2 | * | 8/2003 | Okada et al. ................. 716/18 |
| 6,728,945 | B1 | * | 4/2004 | Wang ........................... 716/18 |
| 2001/0016936 | A1 | | 8/2001 | Okada et al. |
| 2002/0026305 | A1 | | 2/2002 | Boca et al. |

FOREIGN PATENT DOCUMENTS

JP 2001-229217 8/2001

OTHER PUBLICATIONS

Kaneko. M., et al., "Assignment Based Approach to High Level Synthesis for NetRelevant Dsign Criteria", in Technical Report of IEICE., VID 98–147, ICD98–293(Mar. 1999), The Institute of Electronics, Information and Communication Engineers., pp 49–56.

* cited by examiner

*Primary Examiner*—Stacy A. Whitmore
*Assistant Examiner*—Binh Tat
(74) *Attorney, Agent, or Firm*—Hamre, Schumann, Mueller & Larson, P.C.

(57) ABSTRACT

A high-level synthesis method of the present invention includes: generating a CDFG (Control Data Flow Graph) based an input file describing a behavior of a digital circuit; allocating each node of the CDFG generated in the CDFG generation, expressing contents of processing, to a time synchronized with a clock called a Step, based on the CDFG and a constraint condition of the digital circuit described in a constraint file, thereby scheduling the CDFG; generating allocation information representing how resources for constituting the digital circuit are allocated to respective nodes of the CDFG scheduled in the scheduling, based on resource-level layout information representing a layout of the resources, and circuit information representing a connecting relationship between the resources; and outputting the circuit information generated in the allocation and circuit information generation.

15 Claims, 33 Drawing Sheets

```
FUNCTION (
          unsigned int in1,
          unsigned int in2,
          unsigned int in3,
          unsigned int in4,
          unsigned int in5,
          unsigned int in6,
          unsigned int select1,
          unsigned int select2,
          unsigned int *out
)
{
          unsigned int m1, m2, m3, m4;

m1 = in1 + in2;
          if (select1 == 0) {
                    m2 = in3 + in4;
          }
          else {
                    m2 = in3 + in5;
          }
          m3 = m1 + m2;

if (select2 == 0) {
                    m4 = m3 * in6;
          } else {
                    m4 = m3 * m2;
          }
          *out = m4;
}
```

FIG. 2

| | S1 | S2 | S3 |
|---|---|---|---|
| reg1 | m1 | m3 | m4 |
| reg2 | m2 | | |
| add1 | $+_1$ | $+_4$ | |
| add2 | $+_2$ | | |
| add3 | $+_3$ | | |
| mult1 | | | $*_1$ |
| 2-1MUX1 | add2_reg2<br>add3_reg2 | | |
| 2-1MUX2 | in1 | reg1_add1 | |
| 2-1MUX3 | in2 | reg2_add1 | |
| 2-1MUX4 | | | reg2_mux4<br>in6 |
| 2-1MUX5 | add1_reg1 | add1_reg1 | mult1_reg1 |

| | reg1 | reg2 | add1 | add2 | add3 | 2-1MUX1 | 2-1MUX2 | 2-1MUX3 | 2-1MUX4 | 2-1MUX5 | FSM |
|---|---|---|---|---|---|---|---|---|---|---|---|
| reg1 | | 5 | 7 | 3 | 5 | 3 | 8 | 6 | 5 | 1 | 3 |
| reg2 | | | 4 | 2 | 3 | 3 | 3 | 2 | 4 | 4 | 6 |
| add1 | | | | 6 | 2 | 4 | 1 | 2 | 8 | 6 | 3 |
| add2 | | | | | 3 | 3 | 4 | 3 | 2 | 5 | 7 |
| add3 | | | | | | 2 | 3 | 2 | 5 | 3 | 3 |
| 2-1MUX1 | | | | | | | 5 | 4 | 5 | 2 | 3 |
| 2-1MUX2 | | | | | | | | 2 | 4 | 5 | 3 |
| 2-1MUX3 | | | | | | | | | 4 | 5 | 3 |
| 2-1MUX4 | | | | | | | | | | 6 | 8 |
| 2-1MUX5 | | | | | | | | | | | 3 |
| FSM | | | | | | | | | | | |

FIG. 8

| R1 | R2 | R3 | R4 | R5 | R6 |
|----|----|----|----|----|----|
| 9  | 6  | 6  | 4  | 6  | 2  |

FIG. 9

|  | S1 | S2 | S3 |
|---|---|---|---|
| reg1 | m1 | m3 |  |
| reg2 | m2 |  |  |
| reg3 |  |  | m4 |
| add1 | $+_1$ | $+_4$ |  |
| add2 | $+_2$ |  |  |
| add3 | $+_3$ |  |  |
| mutl1 |  |  | $*_1$ |
| 2-1MUX1 | add2_reg2<br>add3_reg2 |  |  |
| 2-1MUX2 | in1 | reg1_add1 |  |
| 2-1MUX3 | in2 | reg2_add1 |  |
| 2-1MUX4 |  |  | reg2_mux4<br>in6 |

FIG. 11

|  | S1 | S2 | S3 |
|---|---|---|---|
| reg1 | m1 | | |
| reg2 | m2 | | |
| reg3 | | m3 | |
| reg4 | | | m4 |
| add1 | $+_1$ | | |
| add2 | $+_2$ | | |
| add3 | $+_3$ | | |
| add4 | | $+_4$ | |
| mutl1 | | | $*_1$ |
| 2-1MUX1 | add2_reg2<br>add3_reg2 | | |
| 2-1MUX2 | | | reg2_mux4<br>in6 | m1 or m2 can be shared with m3 and m4

FIG. 17

|        | reg1 | reg2 | reg3 | reg4 | add1 | add2 | add3 | add4 | mult1 | 2-1MUX1 | 2-1MUX2 | FSM |
|--------|------|------|------|------|------|------|------|------|-------|---------|---------|-----|
| reg1   |      | 4    | 5    | 9    | 1    | 3    | 5    | 6    | 7     | 2       | 8       | 2   |
| reg2   |      |      | 1    | 5    | 5    | 2    | 2    | 4    | 3     | 1       | 4       | 4   |
| reg3   |      |      |      | 2    | 6    | 2    | 1    | 2    | 2     | 2       | 2       | 4   |
| reg4   |      |      |      |      | 9    | 4    | 3    | 1    | 1     | 4       | 4       | 4   |
| add1   |      |      |      |      |      | 1    | 3    | 6    | 10    | 3       | 8       | 3   |
| add2   |      |      |      |      |      |      | 1    | 4    | 5     | 1       | 3       | 3   |
| add3   |      |      |      |      |      |      |      | 3    | 4     | 2       | 2       | 4   |
| add4   |      |      |      |      |      |      |      |      | 2     | 3       | 5       | 2   |
| mult1  |      |      |      |      |      |      |      |      |       | 4       | 2       | 4   |
| 2-1MUX1|      |      |      |      |      |      |      |      |       |         | 4       | 1   |
| 2-1MUX1|      |      |      |      |      |      |      |      |       |         |         | 6   |
| FSM    |      |      |      |      |      |      |      |      |       |         |         |     |

FIG. 19

| R1 | R2 | R3 | R4 | R5 | R6 |
|---|---|---|---|---|---|
| 7 | 7 | 6 | 1 | 3 | 2 |

FIG. 20

|  | S1 | S2 | S3 |
|---|---|---|---|
| reg1 | m1 | | |
| reg3 | m2 | m3 | |
| reg4 | | | m4 |
| add1 | $+_1$ | | |
| add2 | $+_2$ | | |
| add3 | $+_3$ | | |
| add4 | | $+_4$ | |
| mutl1 | | | $*_3$ |
| 2-1MUX1 | add2_reg2<br>add3_reg2 | | |
| 2-1MUX2 | | | reg2_mux4<br>in6 | m2 and m3 are shared

FIG. 22

HIGH-LEVEL SYNTHESIS METHOD

BACKGROUND OF THE INVENTION

1. Field of the Invention

The present invention relates to a high-level synthesis method for generating a circuit description of a digital circuit based on a behavioral description of the digital circuit. In particular, the present invention relates to an allocation method for allocating a resource for executing each process in an operation description to each process.

2. Description of the Related Art

Due to the advancement of techniques for increasing smaller LSI circuits, the number of gates that can be integrated in one chip has increased remarkably. In order to design such a LSI in a short period of time and efficiently, a high-level synthesis technique for generating circuit information based on a behavioral description of hardware has been utilized. An example of the document describing the detail of the high-level synthesis technique includes Daniel Gajski, Nikil Dutt, Allen Wu, Steve Lin, "HIGH-LEVEL SYNTHESIS Introduction to Chip and System Design", Kluwer Academic Publishers, 1992.

FIG. 28 is a flow chart showing a conventional high-level synthesis method. First, in CDFG generation, a CDFG (Control Data Flow Graph) is generated based on an input file describing a behavior of a digital circuit (Step S201). Then, in scheduling, each node of the CDFG representing the contents of processing is allocated to a time synchronized with a dock called Step, based on the generated CDFG and the constraint condition of the digital circuit described in a constraint file, whereby the CDFG is scheduled (Step S202). Next, in allocation and circuit information generation, circuit information and allocation information representing how resources for constituting the digital circuit are allocated to respective nodes of the CDFG scheduled in the scheduling are generated (Step S91). Thereafter, the circuit information is output in outputting (Step S208).

Then, it is determined whether or not the circuit information generated in the allocation and circuit information generation satisfies a predetermined standard representing the constraint condition of the digital circuit (Step S92). When it is determined that the circuit information does not satisfy a predetermined standard (NO in Step S92), the process returns to Step S201.

When it is determined that the circuit information satisfies a predetermined standard (YES in Step S92), the circuit information generated in the allocation and circuit information generation is subjected to logic synthesis processing in logic synthesis (Step S93). Then, it is determined whether or not the circuit information subjected to the logic synthesis processing in the logic synthesis satisfies a predetermined standard representing the constraint condition of the digital circuit (Step S94). When it is determined that the circuit information does not satisfy a predetermined standard (NO in Step S94), the process returns to Step S201.

When it is determined that the circuit information satisfies a predetermined standard (YES in Step S94), the circuit information subjected to the logic synthesis processing in the logic synthesis is subjected to layout processing in layout (Step S95). Then, it is determined whether or not the circuit information subjected to the layout processing in the layout satisfies a predetermined standard representing the constraint condition of the digital circuit (Step S96). When it is determined that the circuit information does not satisfy a predetermined standard (NO in Step S96), the process returns to Step S201. When it is determined that the circuit information satisfies a predetermined standard (YES in Step S96), the process is completed.

Thus, in a design flow of a LSI starting from the high-level synthesis, the design proceeds in the following order: high-level synthesis, logic synthesis, and layout, using a behavioral description of hardware as an input. If the design constraint is not satisfied in each operation, the process is restarted from the high-level synthesis in the worst case.

Conventionally, in order to minimize a manual return loss from a downstream operation after the high-level synthesis, in the high-level synthesis, the maximum shared number of arithmetic operation unit resources and memory resources is limited, and the connection number between the arithmetic operation unit resources and the memory resources is limited so as to prevent the wiring from being congested during layout ("High-level synthesis considering a wiring resource", Nishio, Kaneko, Tayu, in "Technical Report of IEICE, VLD98–147, pp.49–56, 1999–03).

Furthermore, in the layout, arrangement is performed so that the connecting line between the resources having an effect on circuit performance is not too long, or the congestion degree in a layout region is not high. Thus, measures are taken separately in the respective operations, whereby manual return is minimized.

However, the above-mentioned measures have been taken by human beings from an experimental point of view. Therefore, the high-level synthesis and the layout are not coordinated. Furthermore, in the development of a LSI, several months are required for completing the operations from the high-level synthesis to the layout. Therefore, when a manual return loss of returning from a downstream operation to an upstream operation occurs, a LSI cannot be put on the market at an early time.

According to the conventional high-level synthesis method, a circuit is produced only based on the design constraint created by the experimental determination of human beings without analyzing problems arising in downstream operations (in particular, problems arising in the layout) in detail. This makes it necessary to provide a use limit for a circuit adopting a high-level synthesis system, such as a circuit in which a design constraint regarding the performance, area, and the like is not critical, a circuit having a margin of a development time, or a circuit with a small scale, which can be manually corrected by a human being in a downstream operation.

Furthermore, in the case where a design constraint is not satisfied in a downstream operation after a high-level synthesis operation, in order to reflect feedback information from the downstream operation to a high-level synthesis method, a program file and a design constraint file to be input to a high-level synthesis system need to be corrected.

SUMMARY OF THE INVENTION

Therefore, with the foregoing in mind, it is an object of the present invention to provide a high-level synthesis method for producing a RTL lower level circuit description having high implementability in a downstream operation after high-level synthesis, particularly, in layout.

In order to achieve the above-mentioned object, a high-level synthesis method of the present invention includes generating a CDFG (Control Data Flow Graph) based on an input file describing a behavior of a digital circuit; scheduling the CDFG by allocating each node of the generated CDFG, expressing contents of processing, to a time synchronized with a clock called a Step, based on the CDFG and a constraint condition of the digital circuit described in a constraint file; generating allocation information representing how resources for constituting the digital circuit are allocated to respective nodes of the CDFG scheduled in the scheduling, based on resource-level layout information representing a layout of the resources, and circuit information representing a connecting relationship between the resources; and outputting the circuit information generated in the allocation and circuit information generation.

According to the present invention, a high-level synthesis method for generating a low level circuit description has high implementability in a downstream operation after high-level synthesis, particularly, in layout.

These and other advantages of the present invention will become apparent to those skilled in the art upon reading and understanding the following detailed description with reference to the accompanying figures.

BRIEF DESCRIPTION OF THE DRAWINGS

FIG. 2 is a view showing an exemplary input file describing a behavior of a digital circuit.

FIG. 6 is a view showing lifetime information of each resource generated in the initial sharing allocation and circuit information generation according to the high-level synthesis method of Embodiment 1.

FIG. 8 is a view showing resource-level layout information generated in resource-level layout according to the high-level synthesis method of Embodiment 1.

FIG. 9 is a view showing another resource-level layout information generated in the resource-level layout according to the high-level synthesis method of Embodiment 1.

FIG. 11 is a view showing correction lifetime information of each resource generated in the resource dividing allocation and circuit information generation according to the high-level synthesis method of Embodiment 1.

FIG. 17 is a view showing lifetime information of each resource generated in the initial non-sharing allocation and circuit information generation according to the high-level synthesis method of Embodiment 2.

FIG. 19 is a view showing resource-level layout information generated in resource-level layout according to the high-level synthesis method of Embodiment 2.

FIG. 20 is a view showing another resource-level layout information generated in the resource-level layout according to the high-level synthesis method of Embodiment 2.

FIG. 22 is a view showing correction lifetime information of each resource generated in the resource shared allocation and circuit information generation according to the high-level synthesis method of Embodiment 2.

DESCRIPTION OF THE PREFERRED EMBODIMENTS

Figure 1:
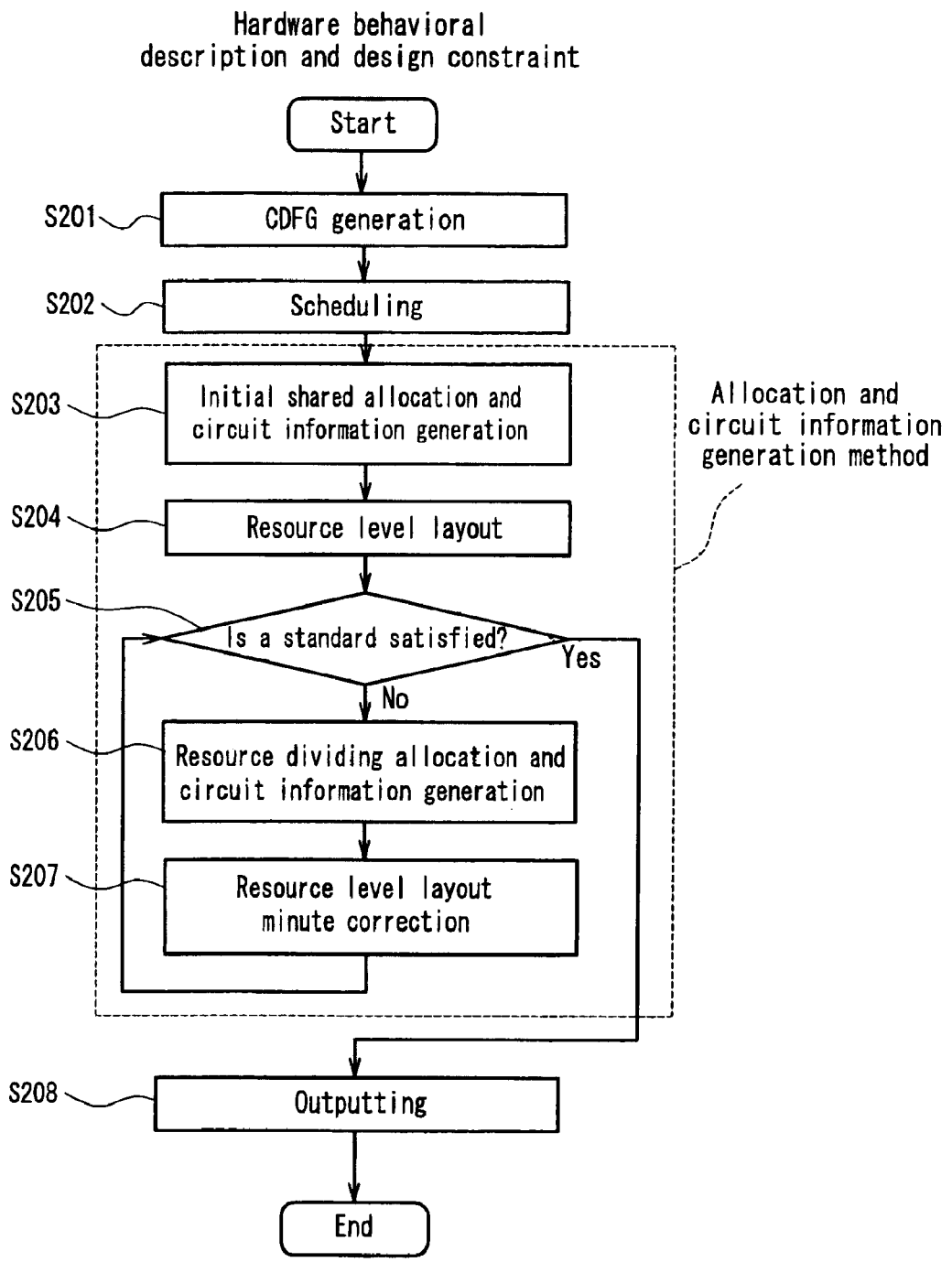
FIG. 1 is a flow chart showing a high-level synthesis method of Embodiment 1.

According to the high-level synthesis method of the present embodiment, allocation information and circuit information are generated. The allocation information represents that resources are allocated to respective nodes of a scheduled CDFG, based on resource-level layout information representing a layout of the resources for constituting a digital circuit. The circuit information represents a connecting relationship between the resources. Because of this, the resource-level layout information obtained during a layout can be fed back to an allocation phase in high-level synthesis. Thus, in the case where a design constraint is not satisfied in a downstream operation after the high-level synthesis, operations from the high-level synthesis to the layout can be performed automatically without correcting an input file or a constraint file in the high-level synthesis. Consequently, in the layout, a RTL circuit with high implementability can be generated.

It is preferable that the allocation and circuit information generation includes generating initial allocation information representing how the resources are allocated to the respective nodes of the CDFG scheduled in the scheduling and initial circuit information representing a connecting relationship between the resources; generating the resource-level layout information, based on the initial circuit information generated in the initial allocation and initial circuit information generation; generating corrected allocation information representing how an allocation of the resources with respect to the respective nodes of the CDFG is changed and corrected circuit information representing how the connecting relationship between the resources is changed, based on the initial allocation information generated in the initial allocation and initial circuit information generation and the resource-level layout information; and minutely correcting the resource-level layout information, based on the corrected circuit information generated in the corrected allocation and corrected circuit information generation, and the corrected allocation and corrected circuit information generation and the resource-level layout minute correction are performed repeatedly until a predetermined standard is satisfied.

It is preferable that the allocation information contains hardware resource allocation information and lifetime information for hardware resources.

It is preferable that the resource-level layout information is distance information of an inter-resource connecting line.

It is preferable that the resource-level layout information is congestion degree information in a layout region of an inter-resource connecting line.

It is preferable that the resource-level layout information is inter-macro connecting line information expressed by any function composed of distance information of an inter-resource connecting line and congestion degree information in a layout region of an inter-resource connecting line.

It is preferable that the resource-level layout information includes a layout influence degree as a coefficient.

It is preferable that the resources are allocated to the respective nodes of the CDFG so as to minimize shared hardware resources in the initial allocation and initial circuit information generation, and an allocation of the resources with respect to the respective nodes of the CDFG is changed so that hardware resources separately implemented are shared in the corrected allocation and corrected circuit information generation.

It is preferable that the resources are allocated to the respective nodes of the CDFG so as to maximize shared hardware resources in the initial allocation and initial circuit information generation, and shared hardware resources are allocated separately in the corrected allocation and corrected circuit information generation.

It is preferable that, in the corrected allocation and corrected circuit information generation, an arrangement distribution variation in a layout region of memory resources is calculated, synthesis ease of a synchronization clock circuit is estimated based on the arrangement distribution variation in a layout region of the memory resources, and sharing with high synthesis ease is selected when the memory resources are shared.

It is preferable that the arrangement distribution variation in the layout region of the memory resources is a variation in number of the memory resources belonging to each region obtained by dividing the layout region into a plurality of regions.

It is preferable that the arrangement distribution variation in the layout region of the memory resources is a total of variations calculated for each hierarchy obtained by dividing the layout region hierarchically.

It is preferable that the resources are allocated to the respective nodes of the CDFG so as to maximize shared hardware resources in the initial allocation and initial circuit information generation, the shared hardware resources are separately allocated in the corrected allocation and corrected circuit information generation, and the allocation and circuit information generation further includes changing the allocation by allowing the hardware resources divided in the corrected allocation and corrected circuit information generation to be shared with the hardware resources that are not shared in the initial allocation and initial circuit information generation.

It is preferable that the resource-level layout information includes a layout influence degree as a layout influence coefficient, and the corrected allocation and corrected circuit information generation and the allocation changing are repeatedly performed while the layout influence coefficient is corrected in stages.

It is preferable that the resource-level layout information minutely corrected in the resource-level layout minute correction is further output in the outputting.

Hereinafter, the present invention will be described by way of illustrative embodiments with reference to the drawings.

Embodiment 1

FIG. 1 is a flow chart showing a high-level synthesis method of Embodiment 1. First, a CDFG is generated based on an input file describing a behavior of a digital circuit in CDFG generation (Step S201).

FIG. 2 shows an exemplary input file describing a behavior of a digital circuit. In the example of the input file shown in FIG. 2, a behavior of a digital circuit is described in the C language. A constraint file describes a circuit constraint condition with respect to an operation speed, power consumption, and a circuit area.

Figure 3:
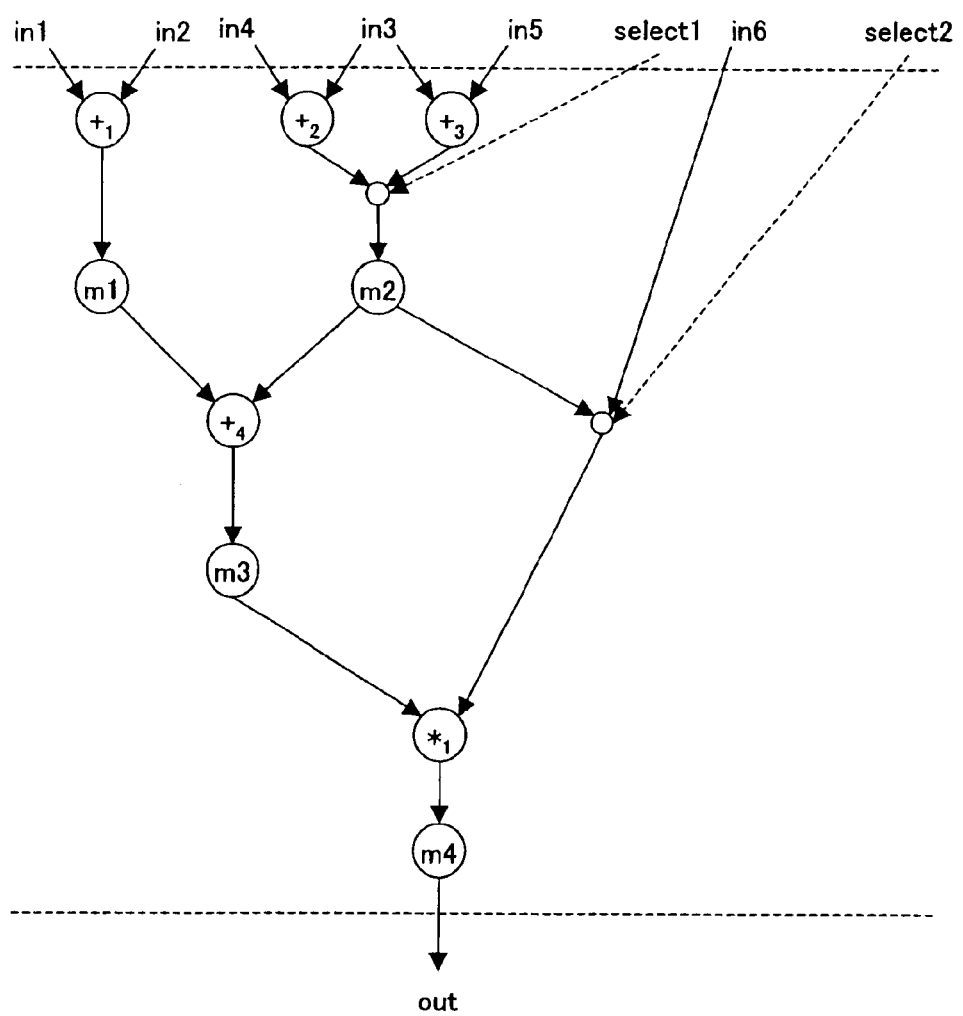
FIG. 3 is a view showing a CDFG generated in CDFG generation according to the high-level synthesis method of Embodiment 1.

FIG. 3 shows a CDFG generated in the CDFG generation according to the high-level synthesis method of Embodiment 1. Solid arrows represent data flow, and broken arrows represent control flow. In the CDFG generation, lexical analysis, syntax analysis, and semantic analysis of the input file are executed in this order to generate the CDFG shown in FIG. 3. In scheduling, each node of the CDFG representing the contents of processing is allocated to a time synchronized with a clock called Step, based on the generated CDFG and a constraint condition of the digital circuit described in the constraint file, whereby the CDFG is scheduled (Step S202).

Figure 4:
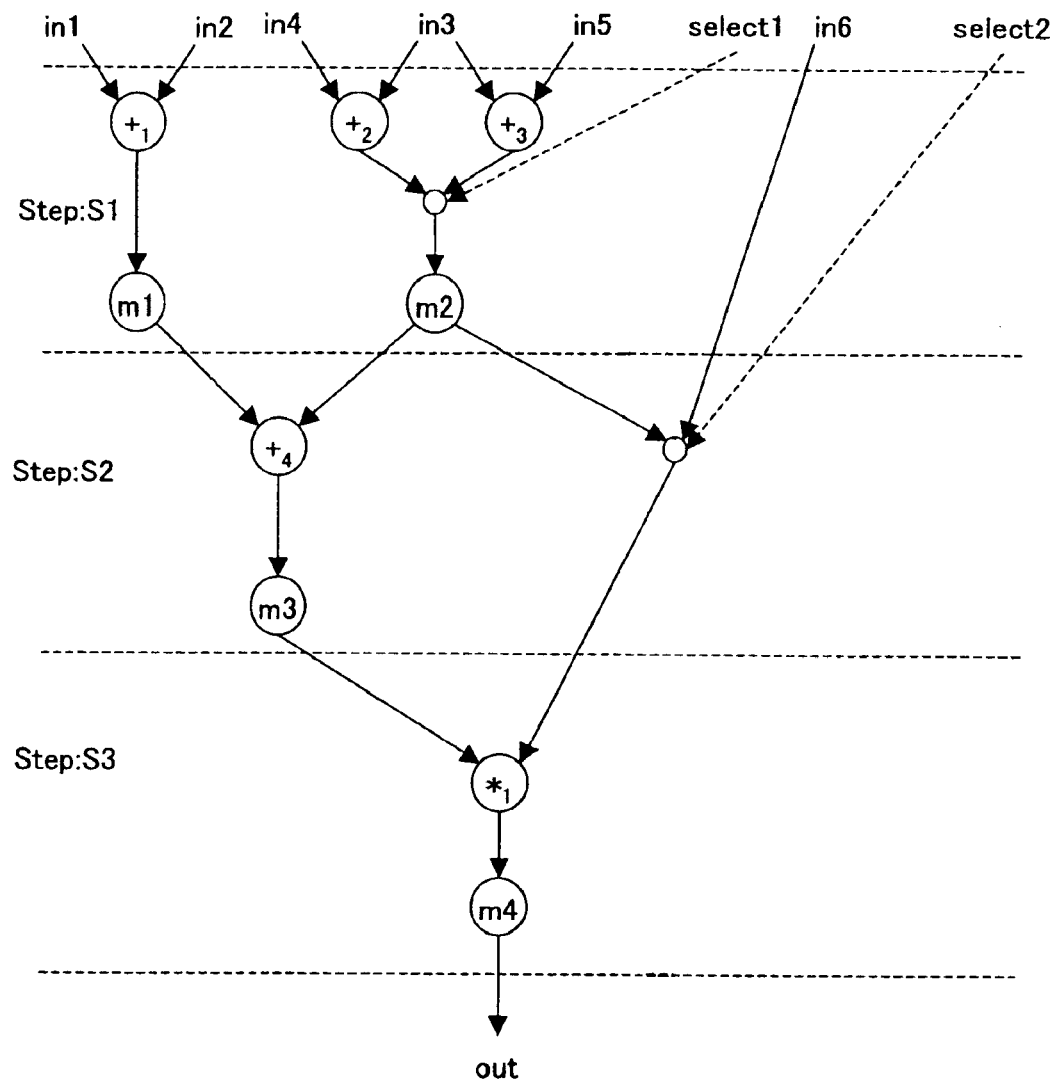
FIG. 4 is a view showing the CDFG scheduled in scheduling according to the high-level synthesis method of Embodiment 1.

FIG. 4 shows each node of the CDFG allocated to a particular Step in the scheduling. In the example shown in FIG. 4, a node +1, a node m1, a node +2, a node +3, and a node m2 of the CDFG are allocated to Step S1. A node +4 and a node m3 of the CDFG are allocated to Step S2 of FSM. A node *1 and a node m4 of the CDFG are allocated to Step S3.

Next, in initial sharing allocation and circuit information generation, initial allocation information representing how arithmetic operation unit resources and memory resources are allocated and initial circuit information representing the connecting relationship between the resources are generated so that each node of the CDFG scheduled in the scheduling shares the arithmetic operation unit resources or the memory resources for constituting the digital circuit as many as possible (Step S203).

Figure 5A:
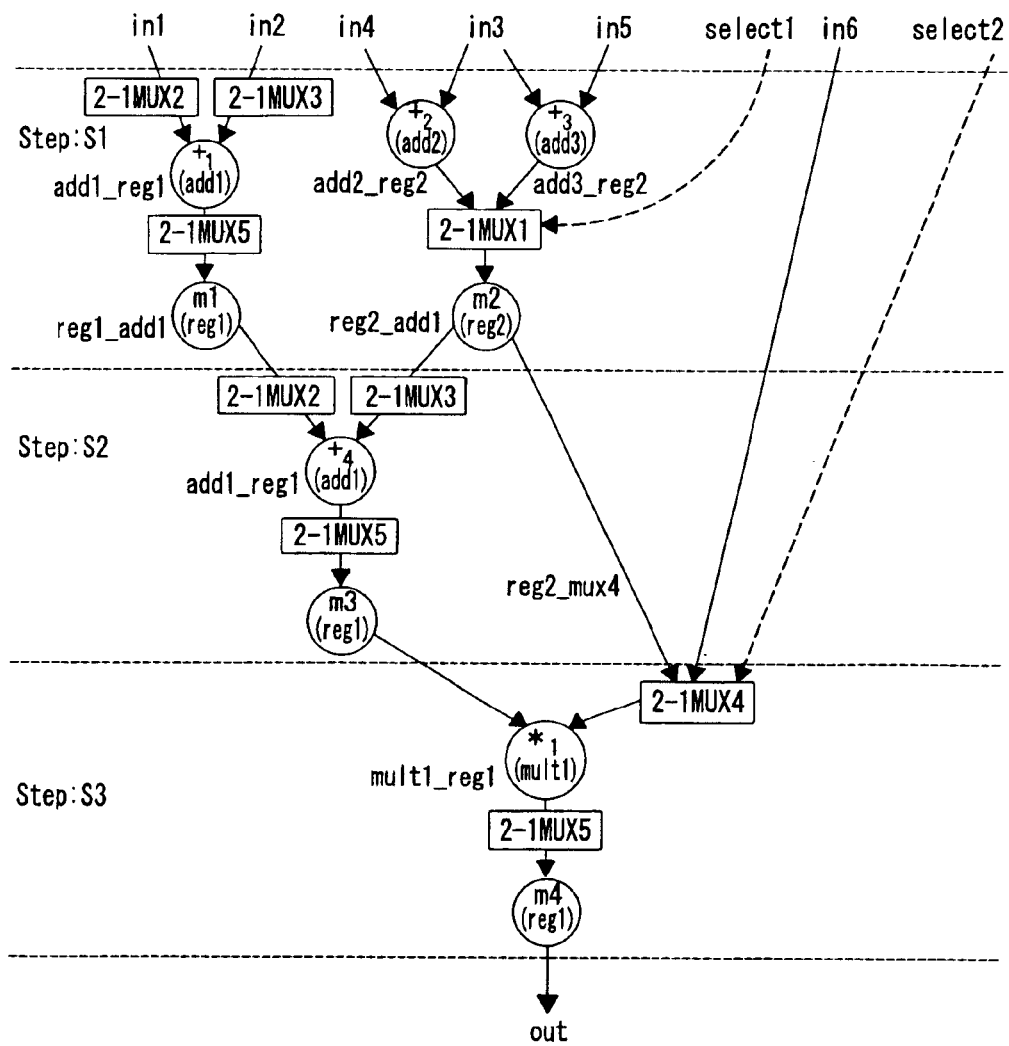
FIG. 5A is a view showing initial sharing allocation information representing how resources are allocated to respective nodes of the CDFG in initial sharing allocation and circuit information generation according to the high-level synthesis method of Embodiment 1.
Figure 5B:
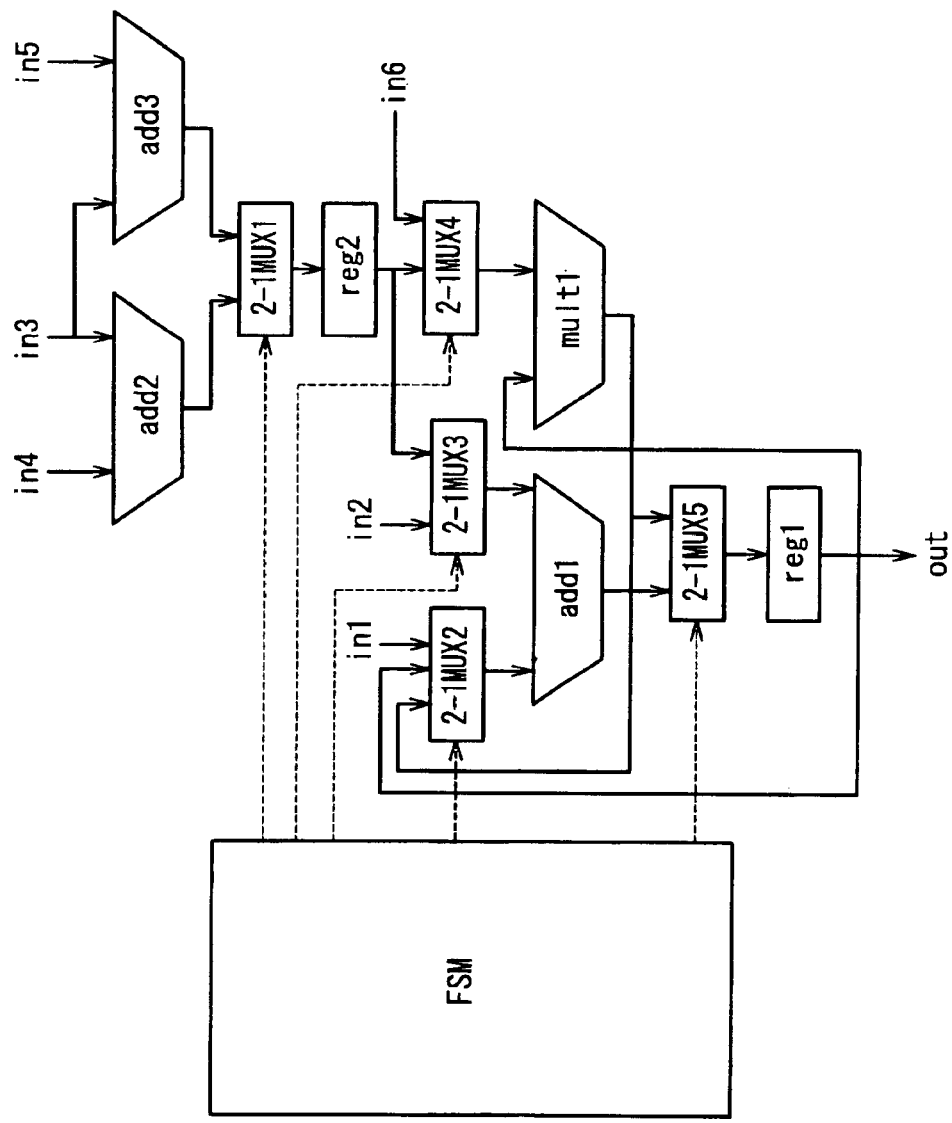
FIG. 5B is a view showing circuit information generated in the initial sharing allocation and circuit information generation.

FIG. 5A shows initial sharing allocation information representing how resources are allocated to respective nodes of the CDFG in the initial sharing allocation and circuit information generation. FIG. 5B shows circuit information generated in the initial sharing allocation and circuit information generation. FIG. 6 shows lifetime information of each resource generated in the initial sharing allocation and circuit information generation. Resources 701 for constituting the digital circuit include memory resource registers reg1 and reg2; adders add1, add2, and add3; a multiplier mult1; and 2-input and 1-output multiplexers 2-1MUX1, 2-1MUX2, 2-1MUX3, 2-1MUX4, and 2-1MUX5.

In the example shown in FIGS. 5A, 5B, and 6, the memory resource register reg1 is commonly allocated to the node m1 allocated to Step S1, the node m3 allocated to Step S2, and the node m4 allocated to Step S3. The memory resource register reg2 is allocated to the node m2 allocated to Step S1. The adder add1 is commonly allocated to the node +1 allocated to Step S1 and the node +4 allocated to Step S2.

The adder add2 is allocated to the node +2 allocated to Step S1, the adder add3 is allocated to the node +3 allocated to Step S1, and the multiplier multi is allocated to the node *1 allocated to Step S3.

An edge add2_reg2 and an edge add3_reg2 allocated to Step S1 are both input to the same port of the memory resource register reg2. Therefore, the input to the memory resource register reg2 is controlled by inserting the multiplexer 2-1MUX1. In an input edge in1 allocated to Step S1 and an edge reg1_add1 allocated to Step S2, the multiplexer 2-1MUX2 is commonly inserted.

In an edge reg2_mux4 and a node in6 allocated to Step S3, the multiplexer 2-1MUX4 is commonly inserted. In an edge add1_reg1 allocated to Step S1 and an edge mult1_reg1 allocated to Step S2, the multiplexer 2-1MUX5 is commonly inserted.

Thereafter, in resource-level layout, resource-level layout information is generated based on the initial circuit information generated in the initial sharing allocation and circuit information generation (Step S204).

Figure 7:
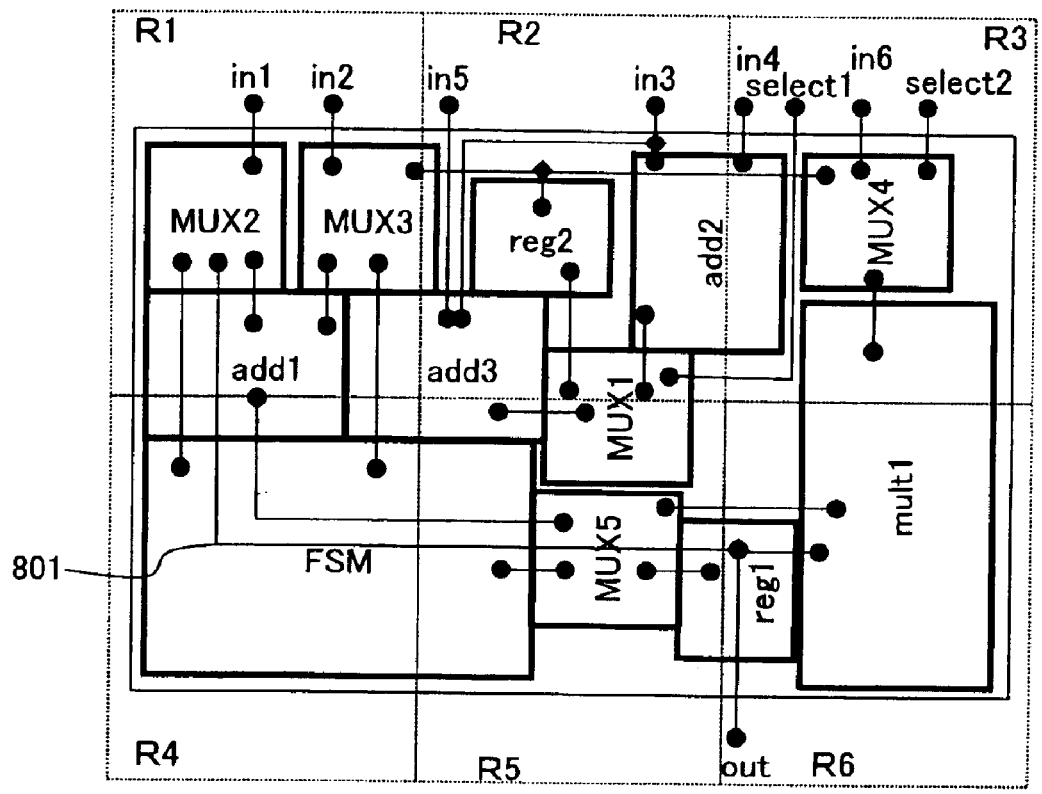
FIG. 7 is a digital circuit laid out in the initial sharing allocation and circuit information generation according to the high-level synthesis method of Embodiment 1.

FIG. 7 shows a digital circuit laid out at a resource-level based on the initial circuit information generated in the initial sharing allocation and circuit information generation. Regions R1 to R6 surrounded by broken lines are layout partial regions used for estimating the degree of wiring congestion. In the example shown in FIG. 7, the digital circuit is divided into six.

FIG. 8 shows resource-level layout information generated in the resource-level layout. Numerical values described in each cell represent distance information of an inter-resource connecting line, which shows the length of a connecting line between the respective resources. For example, the distance information of an inter-resource connecting line between the memory resource register reg1 and the multiplexer 2-1MUX2 is "8", and the distance information of an inter-resource connecting line between the memory resource register reg1 and the multiplexer 2-1MUX5 is "1".

Figure 9:
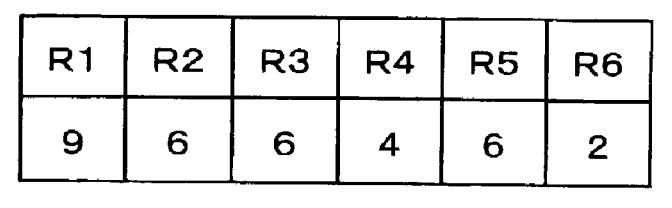

FIG. 9 shows another resource-level layout information generated in the resource-level layout. FIG. 9 shows wiring congestion degree information representing the degree of wiring congestion in the layout partial regions R1, R2, R3, R4, R5, and R6. The wiring congestion degree information is presented by the number of wirings in the respective layout partial regions R1, R2, R3, R4, R5, and R6. In the example shown in FIG. 9, the wiring congestion degree information is "9" in the layout partial region R1. The wiring congestion degree information is "6" in the layout partial region R2. The wiring congestion degree information is "6" in the layout partial region R3. The wiring congestion degree information is "4" in the layout partial region R4. The wiring congestion degree information is "6" in the layout partial region R5. The wiring congestion degree information is "2" in the layout partial region R6. The wiring congestion degree information can be expressed by a complicated method reflecting a more actual layout, for example, considering the number of wiring layers that can be wired, evaluating with horizontal and vertical components, etc.

Then, it is determined whether or not the resource-level layout information generated in the resource-level layout satisfies a predetermined standard representing a constraint condition of the digital circuit described in the constraint file (Step S205). When it is determined that the resource-level layout information satisfies the predetermined standard (YES in Step S205), circuit information is output in outputting (Step S208), and the process is completed.

When it is determined that the resource-level layout information does not satisfy the predetermined standard (NO in Step S205), corrected allocation information, representing how the allocation of resources with respect to respective nodes of the CDFG is changed, and corrected circuit information, representing how the connecting relationship between the resources is changed, are generated in resource dividing allocation and circuit information generation, based on the initial allocation information generated in the initial sharing allocation and circuit information generation and the resource-level layout information generated in the resource-level layout (Step S206).

In the resource dividing allocation (Step S206), shared resources, which cause a design constraint not to be satisfied due to the long inter-resource connecting line distance or the high wiring congestion degree in a layout region ascribed to the sharing of resources, are extracted based on the initial allocation information and the resource-level layout information. Then, corrected allocation information, representing how the allocation of the resources is changed so that respective nodes of the CDFG are allocated to separate resources, and corrected circuit information, representing how the connecting relationship between the resources is changed, are generated.

In the example shown in FIG. 7, the data output from the memory resource register reg1 is subjected to an arithmetic operation by the adder add1 via a multiplexer MUX2, and stored in the memory resource register reg1 again via a multiplexer MUX5. Since a connecting line distance 801 between the multiplexer MUX2 and the memory resource register reg1 obtained from the inter-resource connecting line information is long, circuit performance such as an operation speed or power consumption cannot be satisfied.

The memory resource register reg1 is shared by the nodes m1, m3, and m4 of the CDFG. When the resources are shared in this manner, the distance from a resource at a connection destination is long, and the connection for connecting the respective resources is concentrated, so that the congestion degree in a layout region may be increased.

Figure 10A:
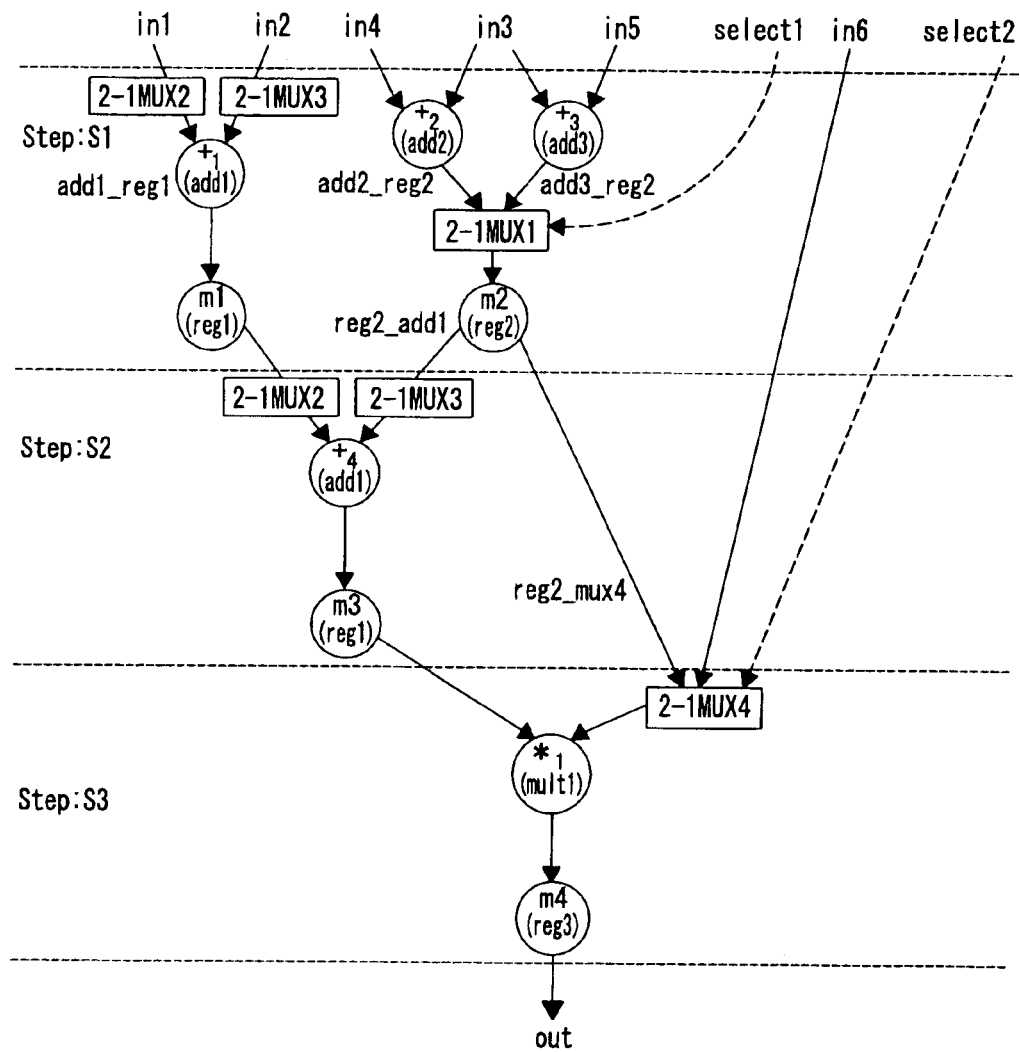
FIG. 10A is a view showing corrected allocation information representing how the allocation of resources with respect to nodes of the CDFG is changed in resource dividing allocation and circuit information generation according to the high-level synthesis method of Embodiment 1.
Figure 10B:
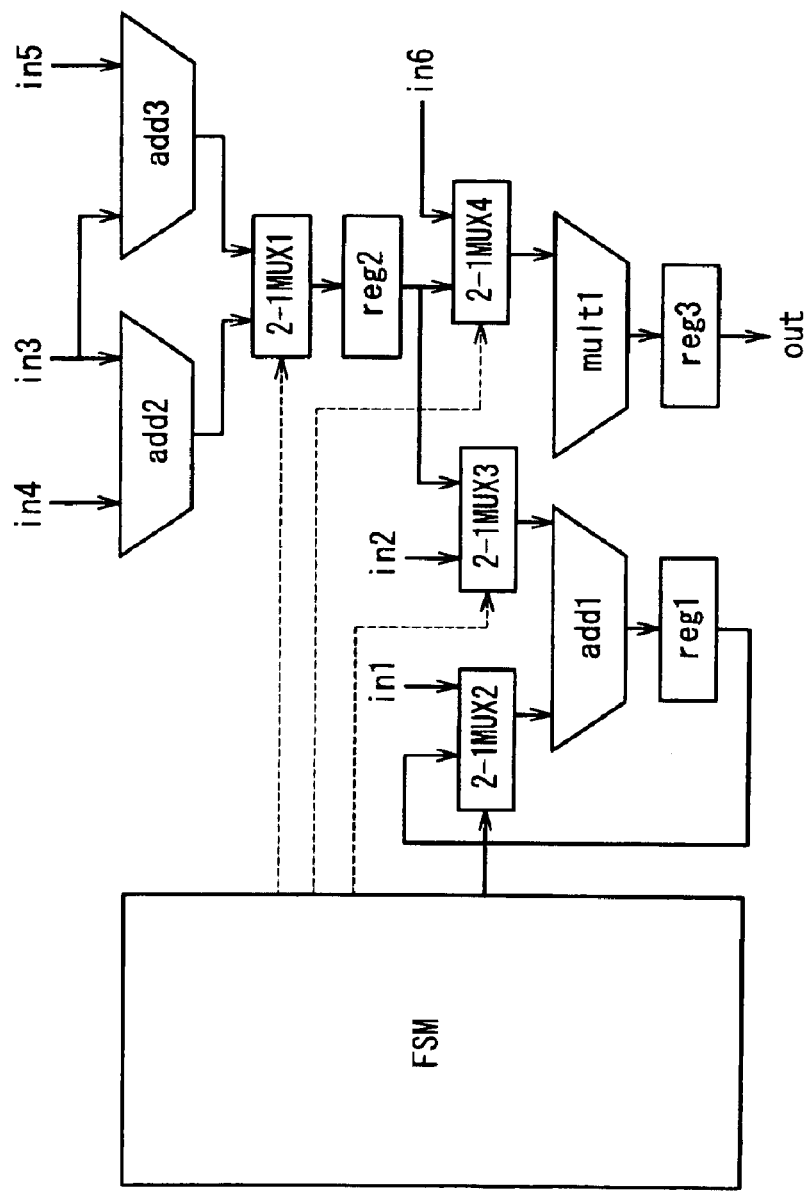
FIG. 10B is a view showing corrected circuit information generated in the resource dividing allocation and circuit information generation.

FIG. 10A shows corrected allocation information representing how the allocation of resources is corrected in the resource dividing allocation and circuit information generation. FIG. 10B shows corrected circuit information generated in the resource dividing allocation and circuit information generation. FIG. 11 shows correction lifetime information of each resource generated in the resource dividing allocation. The same components as those described with reference to FIGS. 5A, 5B, and 6 are denoted with the same reference numerals as those therein. Therefore, the detailed description thereof will be omitted here.

FIGS. 10A, 10B, and 11 are different from FIGS. 5A, 5B, and 6 in the following points. A node m1 allocated to Step S1 and a node m3 allocated to Step S2 are commonly allocated to a memory register reg1, and a node m4 allocated to Step S3 is allocated to a memory register reg3. Thus, the memory resource register reg1, which is commonly allocated to three nodes: the node m1 allocated to Step S1, the node m3 allocated to Step S2, and the node m4 allocated to Step S3 in FIG. 5A, is divided to the memory resource register reg1 commonly allocated to two nodes: the node m1 in Step S1 and the node m3 in Step S2, and the memory resource register reg3 allocated to the node m4 in Step S3.

Next, in resource-level layout minute correction, the resource-level layout information is minutely corrected (Step S207), based on the corrected circuit information generated in the resource dividing allocation and circuit information generation (Step S206).

Figure 12:
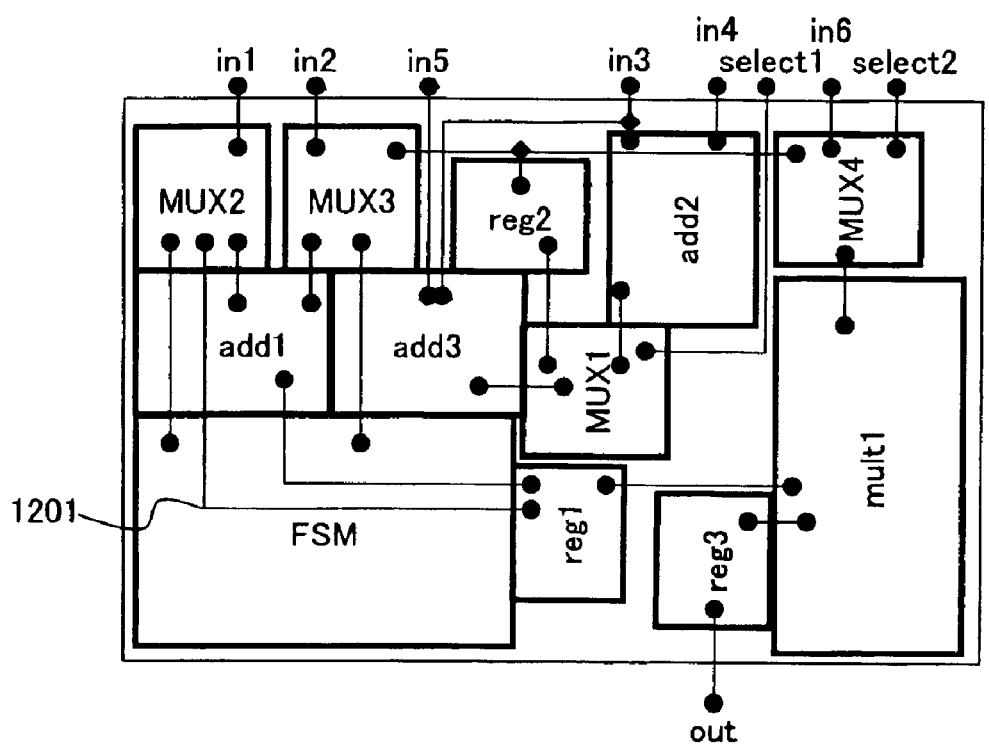
FIG. 12 is view showing a digital circuit with a layout minutely corrected in resource-level layout minute correction according to the high-level synthesis of Embodiment 1.

FIG. 12 shows a digital circuit with a layout minutely corrected in the resource-level layout minute correction. As a result of minutely correcting the layout of the memory resource register reg1 based on the corrected circuit information, a connecting line distance 1201 between the multiplexer MUX2 and the memory resource register reg1 is shorter than a connecting line distance 801 between the multiplexer MUX2 and the memory resource register reg1 before the layout is minutely corrected.

Thereafter, the process returns to Step S205. Thus, the resource dividing allocation and circuit information generation and the resource-level layout minute correction are repeatedly performed until a predetermined standard is satisfied.

As described above, according to Embodiment 1, the corrected allocation information, representing how the allocation of resources is changed based on the resource-level layout information representing the layout of resources for constituting a digital circuit, and the corrected circuit information, representing how the connecting relationship between the resources is changed, are generated with respect to each node of the CDFG scheduled in the scheduling (Step S201). Therefore, the resource-level layout information obtained in the resource-level layout (Step S204) can be fed back to an allocation phase in the high-level synthesis. In the case where the design constraint is not satisfied in a downstream operation after the high-level synthesis, the operations from the high-level synthesis to the layout can be performed automatically without correcting an input file or a constraint file during the high-level synthesis. Consequently, a circuit with high implementability can be generated in the layout.

Figure 13A:
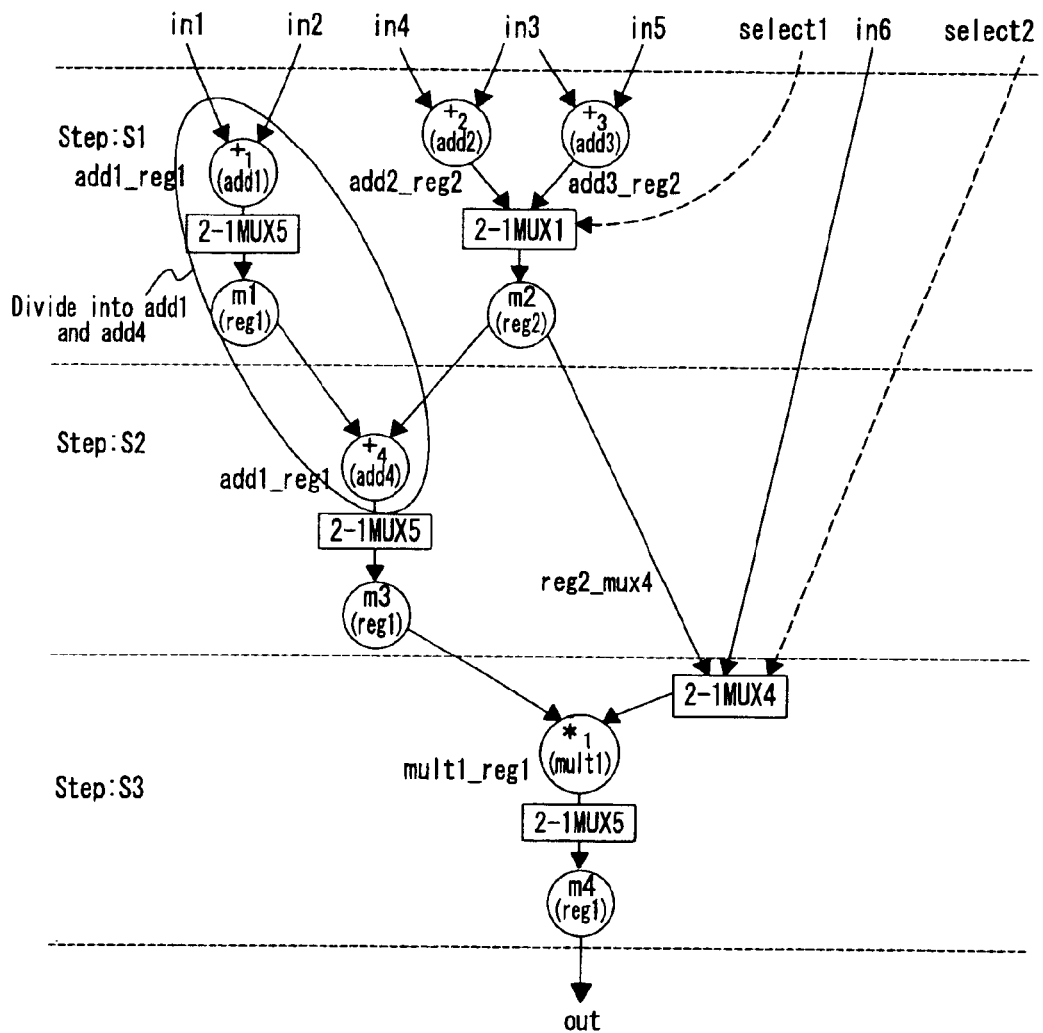
FIG. 13A is a view showing another corrected allocation information generated in the resource dividing allocation and circuit information according the high-level synthesis method of Embodiment 1.
Figure 13B:
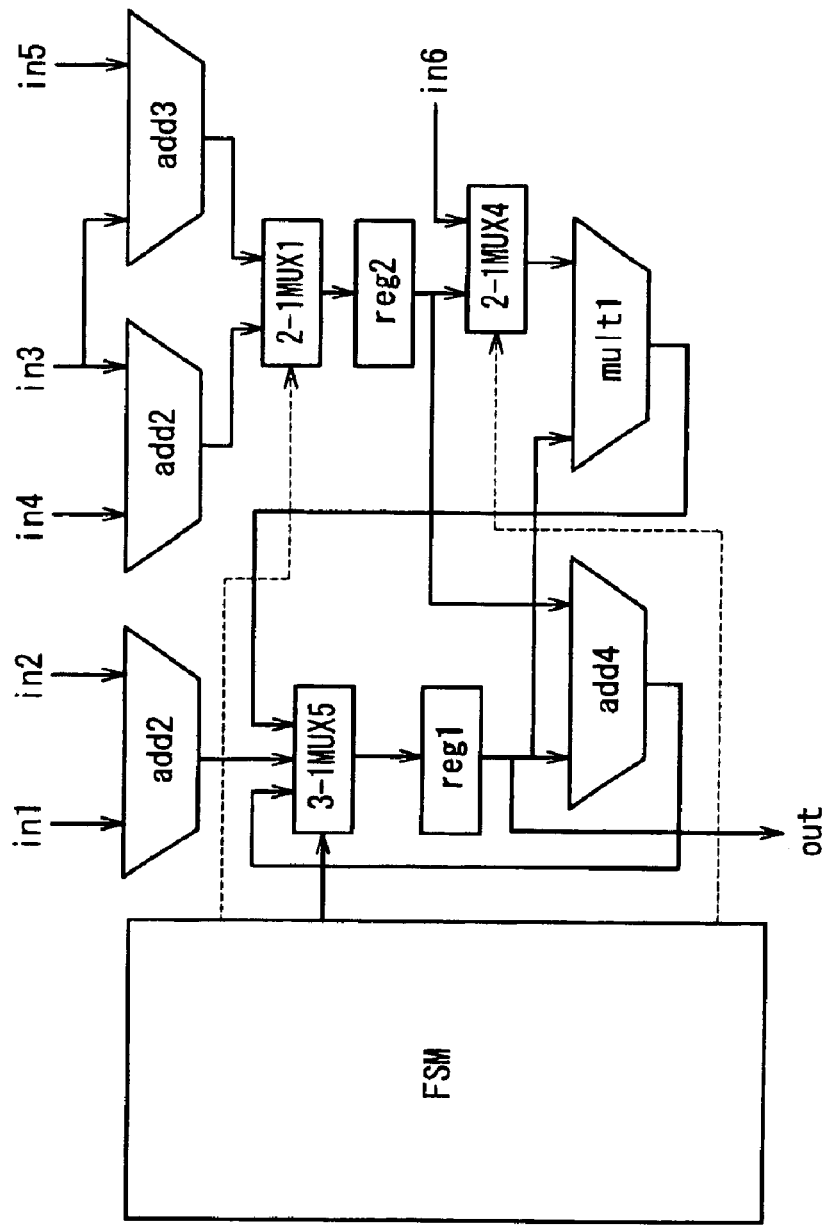
FIG. 13B is a view showing another corrected circuit information generated in the resource dividing allocation and circuit information generation.
Figure 14:
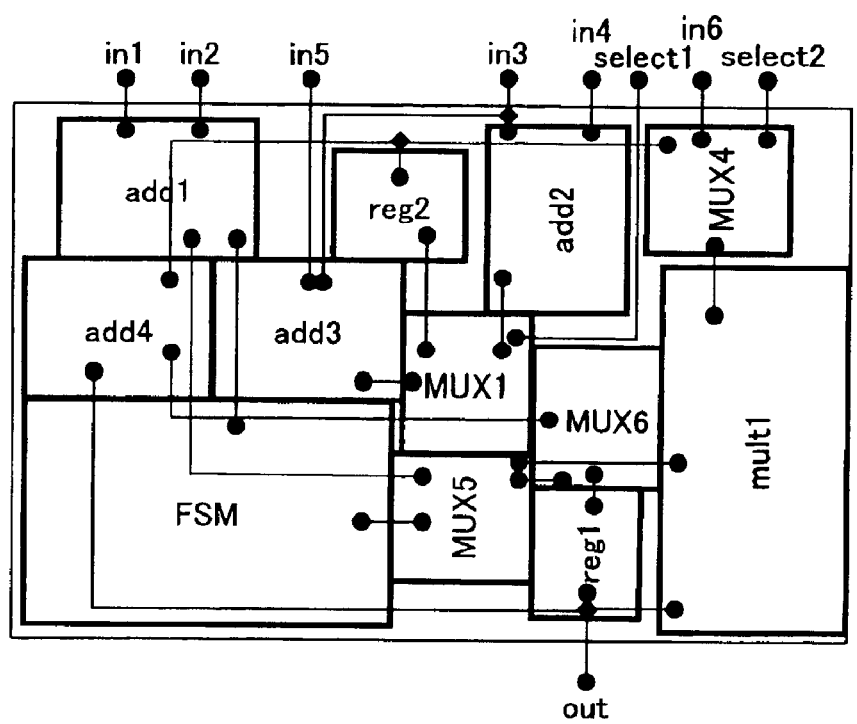
FIG. 14 is a view showing another digital circuit with a layout minutely corrected in the resource-level layout minute correction according to the high-level synthesis method of Embodiment 1.

FIG. 13A shows another corrected allocation information generated in the resource dividing allocation and circuit information generation in the high-level synthesis method of Embodiment 1. FIG. 13B shows another corrected circuit information generated in the resource dividing allocation and circuit information generation. FIG. 14 shows another digital circuit with a layout minutely corrected in the resource-level layout minute correction. In the example shown in FIGS. 10A, 10B, 11, and 12, circuit performance as the design constraint have been described; however, the present invention is not limited thereto. The circuit area also can be evaluated by using congestion degree information. In this case, as shown in FIG. 7, the wiring between the multiplexer MUX2 and the memory resource register reg1 is long, so that the wiring congestion degree in a region R1 is high, which increases a circuit area.

In the resource dividing allocation (Step S206), the allocation information and circuit information are generated again as shown in FIGS. 13A and 13B in the same way as described above so that the adder add1 shared by the node +1 and the node +4 is divided, and then, the layout may be minutely corrected as shown in FIG. 14.

Furthermore, the circuit performance and the circuit area are evaluated simultaneously, and both of them is performed or either one of them is performed in accordance with a priority. Thus, both the circuit performance and the circuit area can be made appropriate. Alternatively, optimization can be performed by trade-off.

Furthermore, when the value of resource-level layout information is increased by adding a margin to the resource-level layout information or decreased so that the value of the resource-level layout information can be changed, the ease of implementing the layout satisfying the constraint in actual layout design can be altered. More specifically, the following may be performed: the layout influence coefficient representing the layout influence is set, and the value of the set layout influence coefficient is multiplied by the value of the resource-level layout information.

As described above, according to Embodiment 1, first, a CDFG, subjected to high-level synthesis so as to maximize shared resources is laid out. Then, using the layout as an initial solution, shared resources, which cause a design constraint not to be satisfied due to the long inter-resource connecting line distance of the resource-level layout information or due to the high wiring congestion degree in a layout region, are reallocated to separated resources, whereby the layout is minutely corrected. These operations are repeated until the design constraint is satisfied, whereby a circuit can be generated at a high level, based on the layout result at a resource-level. Therefore, resources can be shared optimally in a range that does not contradict the design constraint after the layout.

Embodiment 2

Figure 15:
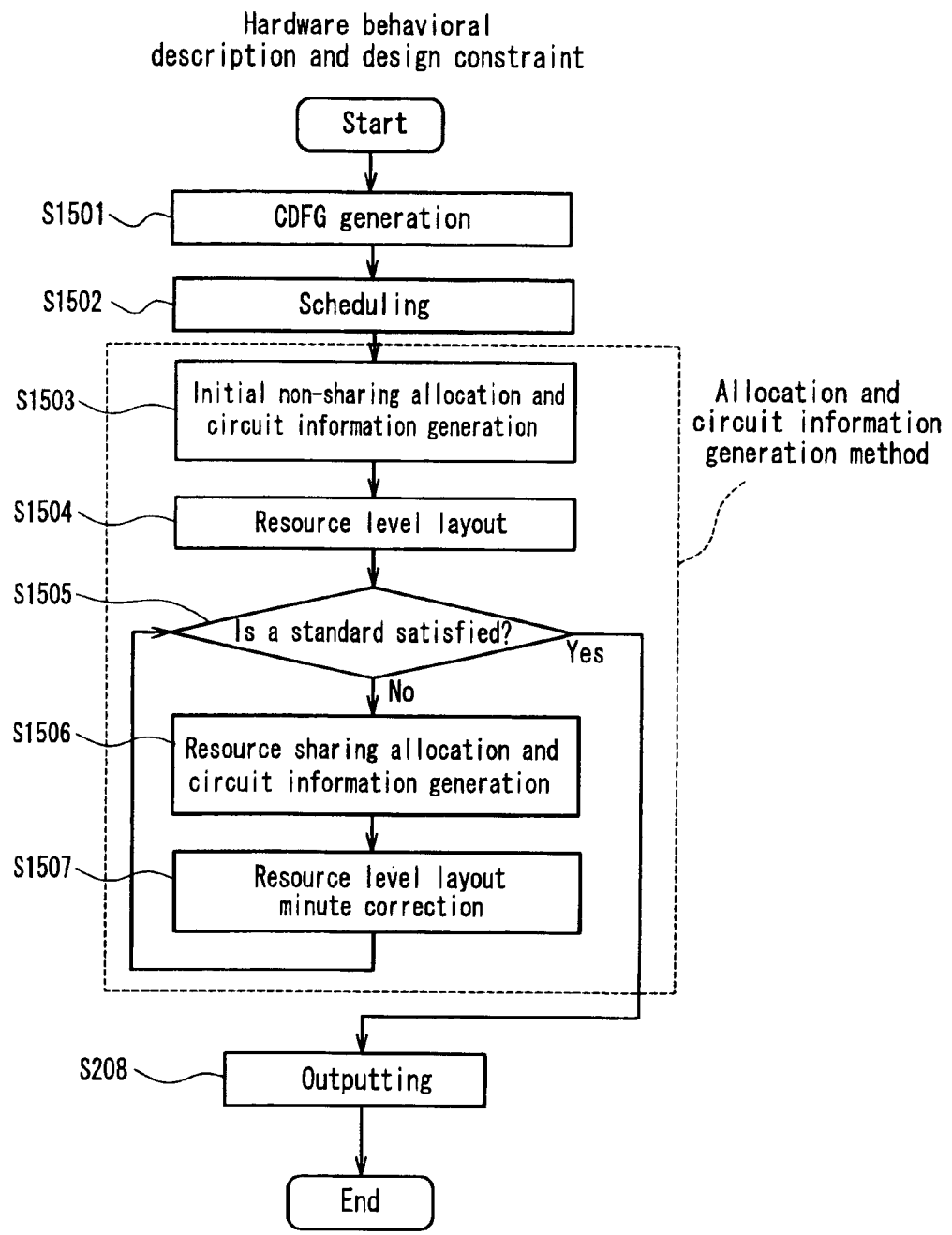
FIG. 15 is a flow chart showing a high-level synthesis method of Embodiment 2.

FIG. 15 is a flow chart showing a high-level synthesis method of Embodiment 2. CDFG generation (Step S1501) and scheduling (Step S1502) respectively are the same as the CDFG generation (Step S201) and the scheduling (Step S202) described with reference to FIG. 1 in Embodiment 1. Therefore, the description thereof will be omitted here.

In initial non-sharing allocation and circuit information generation (Step S1503), initial allocation information, representing how arithmetic operation unit resources or memory resources are allocated to respective nodes of CDFG so that shared hardware resources are minimized, and initial circuit information representing the connecting relationship between the resources, are generated.

Figure 16A:
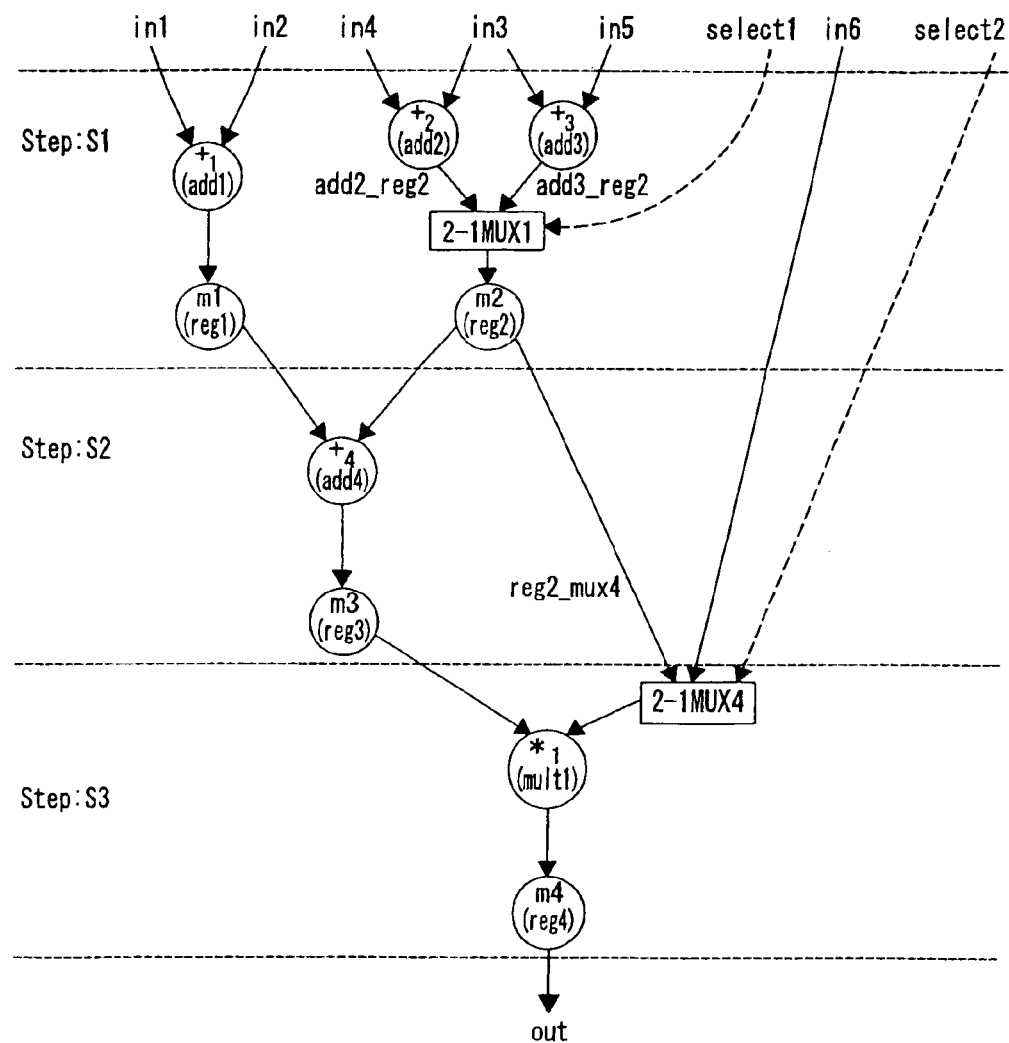
FIG. 16A is a view showing initial non-sharing allocation information representing how resources are allocated to respective nodes of the CDFG in initial non-sharing allocation and circuit information generation according to the high-level synthesis method of Embodiment 2.
Figure 16B:
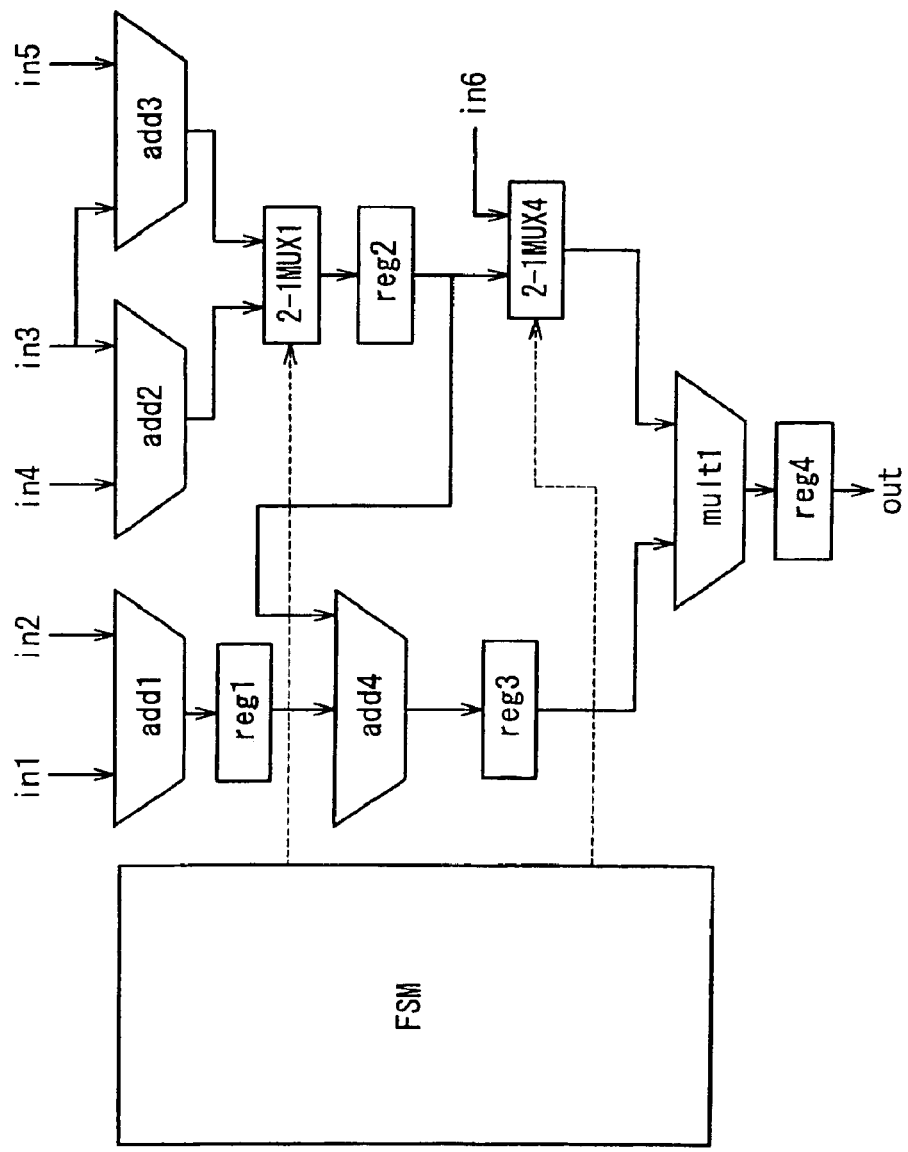
FIG. 16B is a view showing initial circuit information generated in the initial non-sharing allocation and circuit information generation.

FIG. 16A shows initial allocation information representing how resources are allocated to respective nodes of the CDFG in the initial non-sharing allocation and circuit information generation. FIG. 16B shows initial circuit information generated in the initial non-sharing allocation and circuit information generation. FIG. 17 shows lifetime information of each resource generated in the initial non-sharing allocation and circuit information generation.

In the examples shown in FIGS. 16A, 16B, and 17, a memory resource register reg1 is allocated to a node m1 allocated to Step S1. A memory resource register reg2 is allocated to a node m2 allocated to Step S1. A memory resource register reg3 is allocated to a node m3 allocated to Step S2. A memory resource register reg4 is allocated to a node m4 allocated to Step S3.

An adder add1 is allocated to a node +1 allocated to Step S1. An adder add2 is allocated to a node +2 allocated to Step S1. An adder add3 is allocated to a node +3 allocated to Step S1. An adder add4 is allocated to a node +4 allocated to Step S2. A multiplier mult1 is allocated to a node *1 allocated to Step S3.

A multiplexer 2-1MUX1 is commonly allocated to an edge add2__reg2 and an edge add3__reg2 allocated to Step S1. A multiplexer 2-1MUX4 is commonly allocated to an edge reg2__mux4 allocated to Step S3 and a node in6 allocated to Step S3.

Thus, in the initial non-sharing allocation and circuit information generation, arithmetic operation unit resources or memory resources are allocated to respective nodes of the CDFG so that shared hardware resources are minimized.

In resource-level layout, resource-level layout information is generated based on the initial circuit information generated in the initial non-sharing allocation and circuit information generation (Step S1504).

Figure 18:
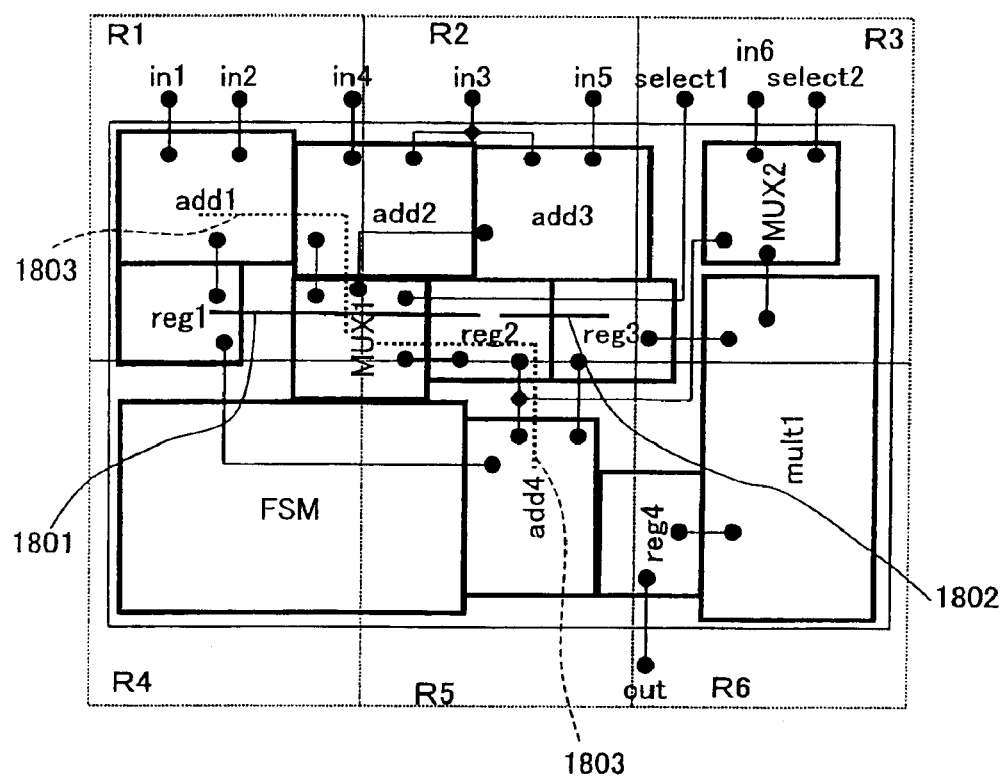
FIG. 18 is a view showing a digital circuit laid out based on initial high-level synthesis information generated in the initial non-sharing allocation and circuit information generation according to the high-level synthesis method of Embodiment 2.

FIG. 18 shows a digital circuit laid out based on the initial circuit information generated in the initial non-sharing allocation and circuit information generation. Regions R1 to R6 surrounded by broken lines are layout partial regions used for estimating a degree of wiring congestion. In the example shown in FIG. 18, the digital circuit is divided into six.

FIG. 19 shows the resource-level layout information generated in the resource-level layout. Numerical values described in each cell represent distance information of an inter-resource connecting line, which shows the length of a connecting line between the respective resources. For example, the distance information of an inter-resource connecting line between the memory resource register reg1 and the memory resource register reg2 is "4", and the distance information of an inter-resource connecting line between the memory resource register reg2 and the memory resource register reg3 is "1".

Figure 20:
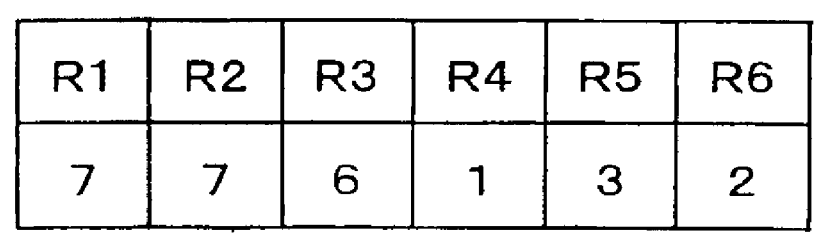

FIG. 20 shows another resource-level layout information generated in the resource-level layout. FIG. 20 shows wiring congestion degree information representing the degree of wiring congestion in the layout partial regions R1, R2, R3, R4, R5, and R6. The wiring congestion degree information is presented by the number of wiring in the respective layout partial regions R1, R2, R3, R4, R5, and R6. In the example shown in FIG. 20, the wiring congestion degree information is "7" in the layout partial region R1. The wiring congestion degree information is "7" in the layout partial region R2. The wiring congestion degree information is "6" in the layout partial region R3. The wiring congestion degree information is "1" in the layout partial region R4. The wiring congestion degree information is "3" in the layout partial region R5. The wiring congestion degree information is "2" in the layout partial region R6.

Then, it is determined whether or not the resource-level layout information generated in the resource-level layout satisfies a predetermined standard representing a constraint condition of the digital circuit described in a constraint file (Step S1505). When it is determined that the resource-level layout information satisfies the predetermined standard (YES in Step S1505), circuit information is output in outputting (Step S208), and the process is completed.

When it is determined that the resource-level layout information does not satisfy a predetermined standard (NO in Step S1505), corrected circuit information, representing how the allocation of resources with respect to respective nodes of the CDFG is corrected, is generated in resource sharing allocation and circuit information generation, based on the initial circuit information generated in the initial non-sharing allocation and circuit information generation and the resource-level layout information generated in the resource-level layout (Step S1506).

In the resource sharing allocation and circuit information generation (Step S1506), corrected allocation information, representing how the allocation of resources is changed by sharing the resources, and corrected circuit information, representing how the connecting relationship between the resources is changed, are generated based on the initial allocation information generated in the initial non-sharing allocation and circuit information generation (Step S1503) and the resource-level layout information generated in the resource-level layout (Step S1504). As a result of sharing of the resources, the distance of a connecting line between the resources is increased and the congestion degree in a layout region is increased. Therefore, herein, resources that can be shared in a range satisfying a design constraint are extracted, and the allocation of the resources is changed so that the extracted resources are shared.

In the example shown in FIG. 18, the memory resource register reg1 or the memory resource register reg2 can be shared with the memory resource register reg3, based on the initial allocation information shown in FIG. 17. Furthermore, a connecting line distance 1801 between the memory resource registers reg2 and reg3, which are candidates for sharing, is shorter than a connecting line distance 1802 between the memory resource register reg1 and the memory resource register reg2, based on distance information of an inter-resource connecting line shown in FIG. 19. A connecting line distance 1803 (between the multiplexer 2-1MUX1 to which data stored in the memory resource register reg2 is output and the adder 4 to which data stored in the memory resource register 3 is output) is the same as a connecting line distance 1804 (between the adder add1 to which data stored in the memory resource register reg1 is output and the multiplexter 2-1MUX1). The congestion degree of the layout partial region R1 to which the memory resource register reg1 belongs is the same as that of the layout partial region R2 to which the memory resource reg3 belongs, based on the congestion degree information in a layout region shown in FIG. 20. When resources that are distant from each other are shared, a connecting line distance is long. Therefore, in the resource sharing allocation, the memory resource register reg2 and the memory resource register reg3 are shared.

Figure 21A:
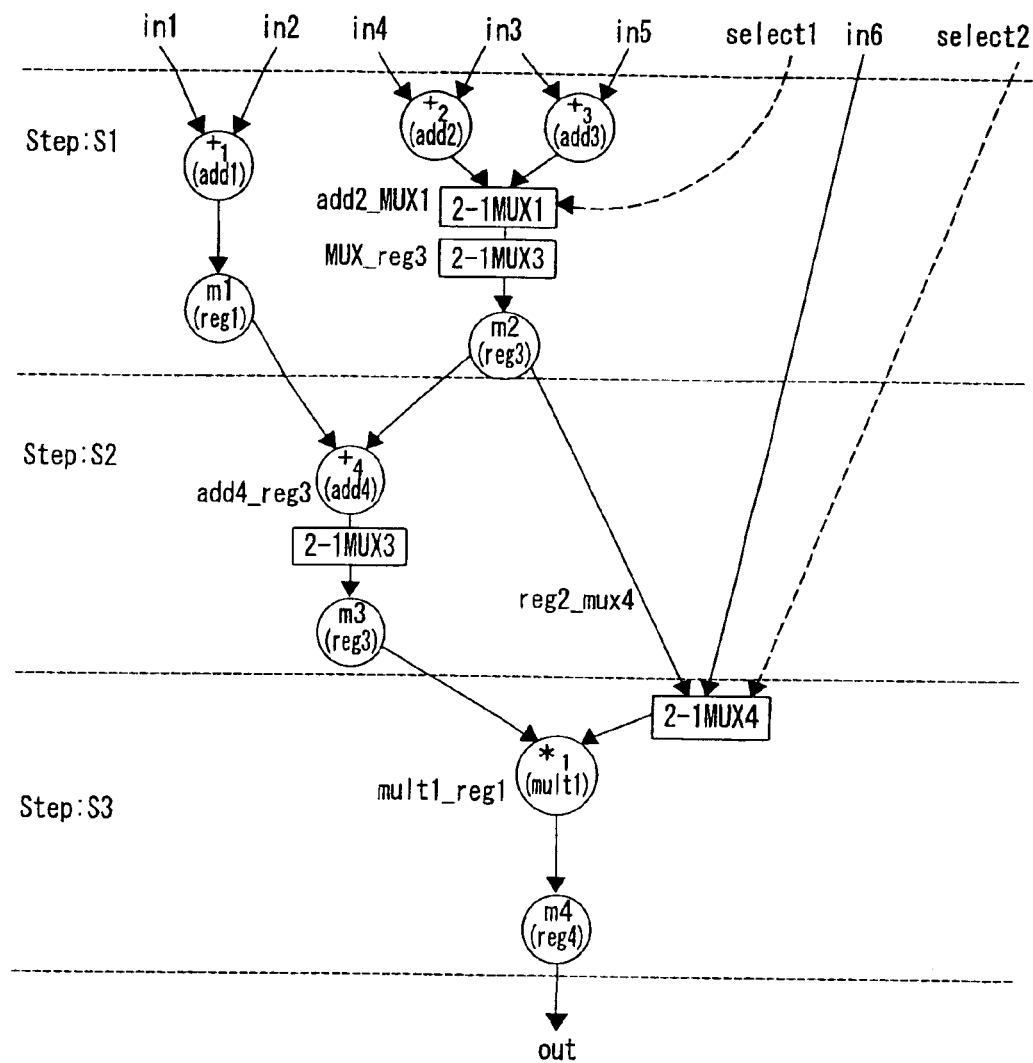
FIG. 21A is a view showing corrected allocation information representing how the allocation is changed in the resource shared allocation and circuit information generation according to the high-level synthesis method of Embodiment 2.
Figure 21B:
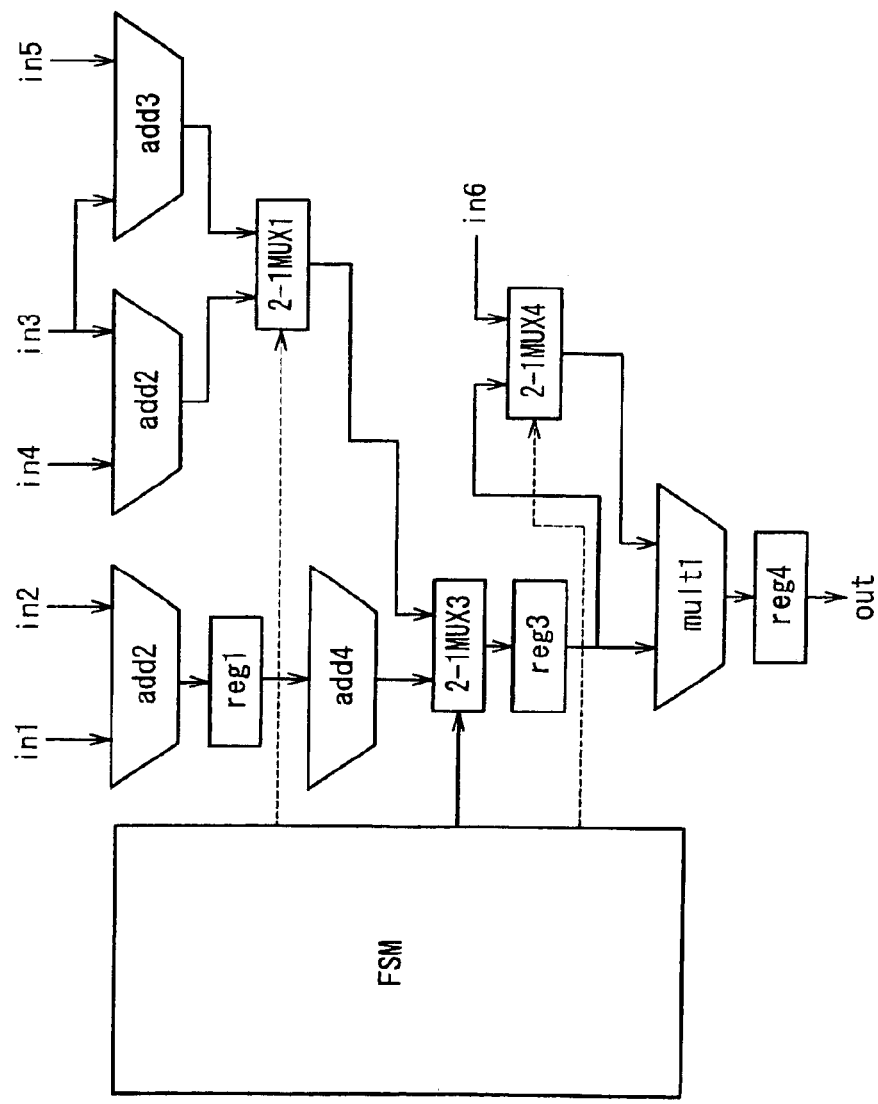
FIG. 21B is a view showing corrected circuit information generated in the resource shared allocation and circuit information generation.

FIG. 21A shows corrected allocation information representing how the allocation of resources to the nodes of the CDFG is changed in the resource sharing allocation and circuit information generation. FIG. 21B shows corrected circuit information generated in the resource sharing allocation and circuit information generation. FIG. 22 shows lifetime information of each resource generated in the resource sharing allocation and circuit information generation.

The node m2 of the CDFG allocated to the memory resource register reg2 and the node m3 of the CDFG allocated to the memory resource register reg3 are commonly allocated to one memory resource register reg3.

Next, the process proceeds to resource-level layout minute correction (Step S1507). The CDFG, after resource sharing allocation is performed, is analyzed, and the layout is minutely corrected.

Figure 23:
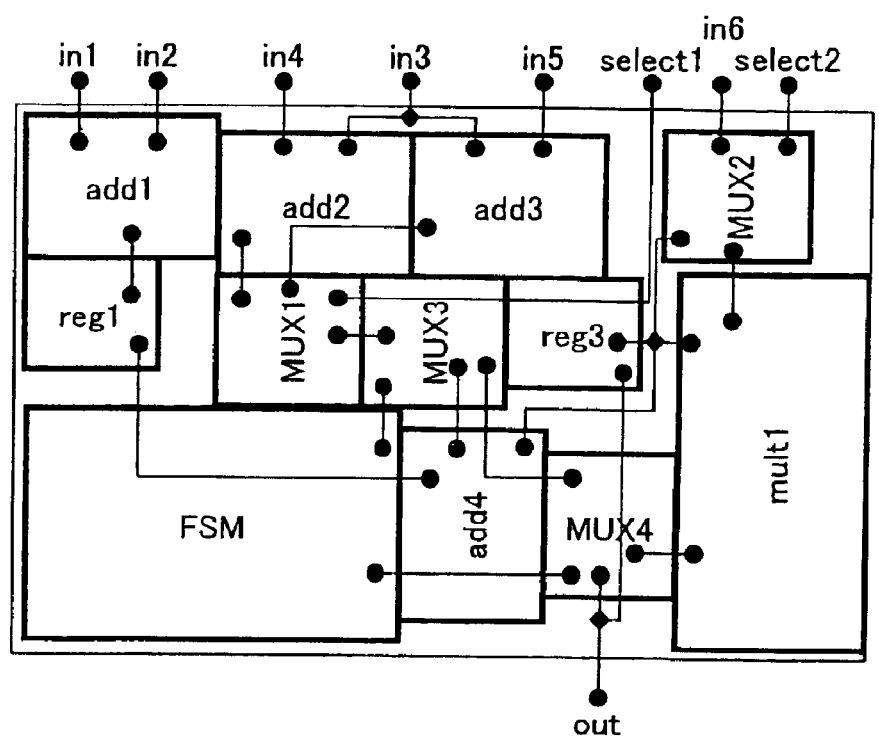
FIG. 23 is a view showing a digital circuit with a layout minutely corrected in resource-level layout minute correction according to the high-level synthesis method of Embodiment 2.

FIG. 23 shows a digital circuit with a layout minutely corrected in the resource-level layout minute correction. A series of processings of the resource sharing allocation (Step S1506) and the resource-level layout minute correction (Step S1507) are repeated as long as a design constraint is satisfied.

As described above, according to Embodiment 2, first, a CDFG subjected to high-level synthesis so as to minimize shared resources is laid out. Then, using the layout as an initial solution, resources are extracted, which can be shared to such a degree that a design constraint is satisfied even when the inter-resource connecting line distance and the wiring congestion degree in a layout region are degraded. The extracted resources are reallocated so as to be shared, whereby the layout is minutely corrected. These operations are repeated as long as the design constraint is satisfied, whereby a circuit can be generated at a high level, based on the layout result at a resource-level. Therefore, resources can be shared optimally in a range that does not contradict the design constraint after the layout.

In Embodiment 2, for simplicity of the description, an example of sharing has been focused on two resources that can be shared. However, the present invention is not limited thereto. Three or more resources can be evaluated simultaneously and shared.

Figure 24:
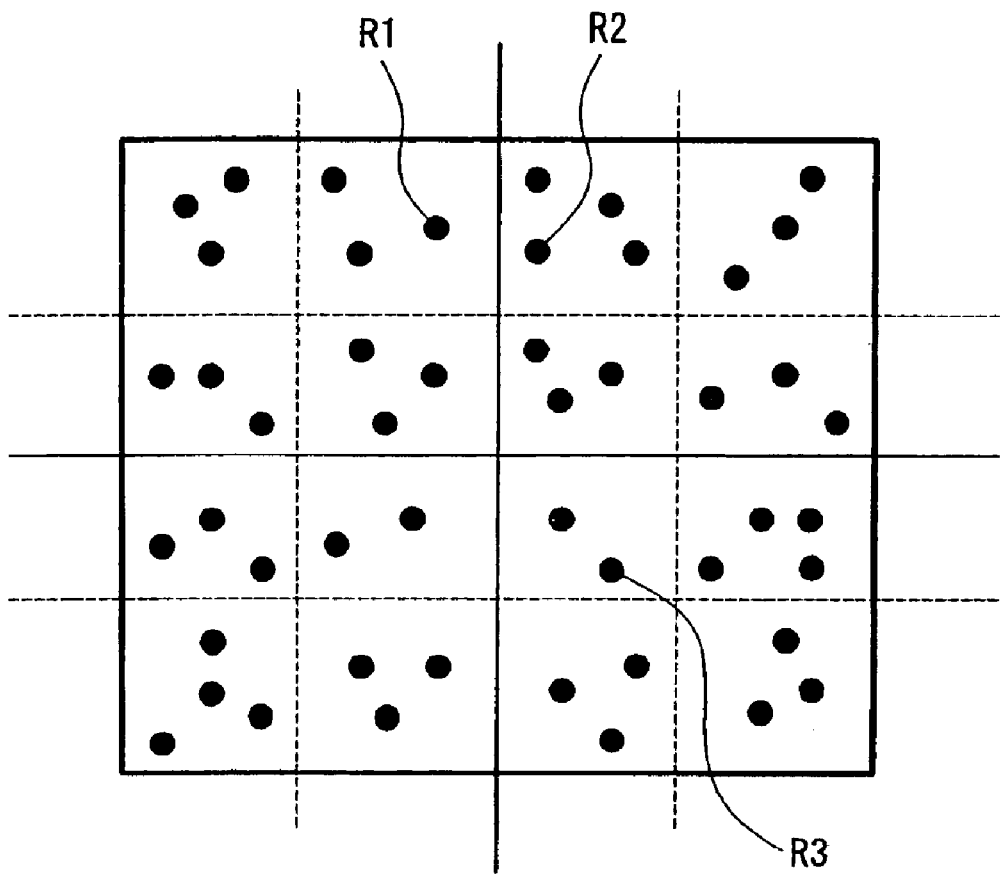
FIG. 24 illustrates a method for estimating synthesis ease of a synchronization system clock circuit according to the high-level synthesis method of Embodiment 2.

Next, a modified example of Embodiment 2 will be described. FIG. 24 illustrates a method for estimating synthesis ease of a synchronization type dock circuit in the high-level synthesis method of Embodiment 2. The modified example of Embodiment 2 is different from Embodiment 2 in that the resource sharing allocation (Step S1506) includes estimating synthesis ease of a synchronization type clock circuit based on the arrangement of all the memory resources, when the resources are shared so as to satisfy a design constraint.

In the layout synthesis executed after the high-level synthesis, a clock circuit is synthesized so that all the clock signals supplied to the respective memory resources reach the memory resources at the same time. The scale of the synchronization type clock circuit to be synthesized depends upon the distribution situation of the positions where the memory resources are arranged. Therefore, it is important to consider the entire distribution in which the memory resources are arranged when the memory resources are shared.

The term "synthesis ease" in the specification refers to the ease with which a circuit is synthesized. As the scale of a circuit to be synthesized is smaller, it becomes easier to synthesize a circuit.

In the modified example of Embodiment 2, by utilizing the fact that the scale of a circuit to be synthesized is increased as the difference between the rough arrangement of the memory resources and the fine arrangement thereof is larger, the arrangement distribution of synchronization resources is made as uniform as possible.

FIG. 24 illustrates a method for estimating synthesis ease of a synchronization type clock circuit in the high-level synthesis method according to the modified example of Embodiment 2. In the example shown in FIG. 24, a layout region is divided into 16 (4 lines×4 columns) regions. In FIG. 24, black solid circles represent memory resources. It is assumed that a memory resource R1 can be shared with any of a memory resource R2 and a memory resource R3 under the above-mentioned condition of Embodiment 2.

Based on the number of the memory resources arranged in each divided region, the variance of the number of the memory resources in the divided regions is calculated. In an initial state, the variance value is 0.33. When the memory resource R1 and the memory resource R2 are shared, the variance value is 0.27. When the memory resource R1 and the memory resource R3 are shared, the variance value is 0.53. In this case, the memory resource R1 and the memory resource R2 are shared so that the variance value is smaller, and the variation in the arrangement positions is decreased.

When the layout region is large, the variance is calculated in stages, whereby the estimation precision can be enhanced. In the example show in FIG. 24, first, the variance is calculated on the basis of regions first level) partitioned by solid lines. Then, the variance is calculated on the basis of the first level with respect to regions (second level) partitioned by broken lines. Thereafter, synthesis ease is estimated based on the sum of the above-mentioned 5 variance values in total. In this case, in an initial state, the variance value is 1.83. When the memory resource R1 and the memory resource R2 are shared, the variance value is 1.83. When the memory resources R1 and R3 are shared, the variance value is 3.16.

As described above, according to the modified example of Embodiment 2, the arrangement distribution of the memory resources can be made uniform. This suppresses the increase in scale of a synchronization type clock circuit to be synthesized. Consequently, the amount of power consumed by a clock circuit can be reduced.

Embodiment 3

Figure 25:
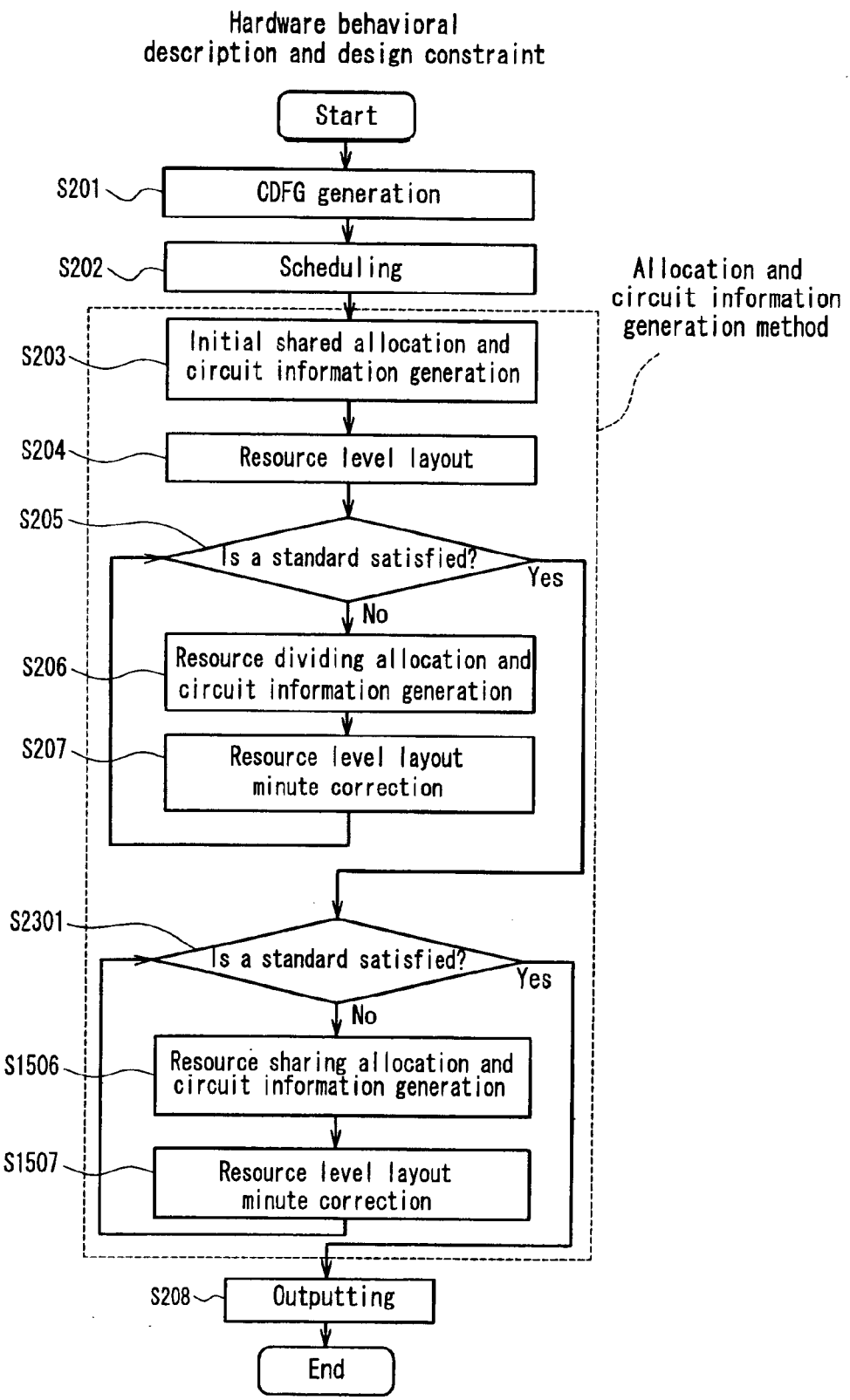
FIG. 25 is a flow chart showing a high-level synthesis method of Embodiment 3.

FIG. 25 is a flow chart showing a high-level synthesis method of Embodiment 3. The same components as those in the flow chart showing the above-mentioned high-level synthesis method described with reference to FIGS. 1 and 15 are denoted with the same reference numerals as those therein. Therefore, the detailed description of these components will be omitted here.

The operations from the CDFG generation (Step S201) to the resource-level layout minute correction (Step S207) are the same as those in Embodiment 1 described with reference to FIG. 1. The resource sharing allocation and circuit information generation (Step S1506) and the resource-level layout minute correction (Step S1507) are the same as those in Embodiment 2 described with reference to FIG. 15.

When it is determined that the resource-level layout information satisfies a predetermined standard (YES in Step S205), it is determined whether or not there is a combination between hardware resources that can be shared based on the allocation information and have not been shared (Step S2301).

When it is determined that there is a combination between hardware resources that can be shared based on the allocation information and have not been shared (NO in Step S2301), combinations of resources are extracted, which can be shared in a range satisfying a design constraint even when the distance of an inter-resource connecting line becomes long or the congestion degree in a layout region is increased by sharing the resources, and the allocation of the resources is changed so that the resources can be shared.

In Embodiment 3, as candidates for sharing, the node m2 allocated to the memory resource register reg2 and the node m4 allocated to the memory resource register reg3 divided in the resource dividing allocation and circuit information generation (Step S206) are selected. The node m2 and the node m4 are a combination of hardware resources that can be shared based on the allocation information shown in FIG. 11 and have not been shared. Furthermore, the memory resource register reg2 and the memory resource register reg3 are close to each other based on the resource-level layout information. Therefore, it can be determined that the design constraint is not contradicted with respect to the distance of an inter-resource connecting line and the congestion degree in a layout region, even if these memory resource registers are shared. Then, the process proceeds to the above-mentioned resource sharing allocation and circuit information generation (Step S1506).

Figure 26:
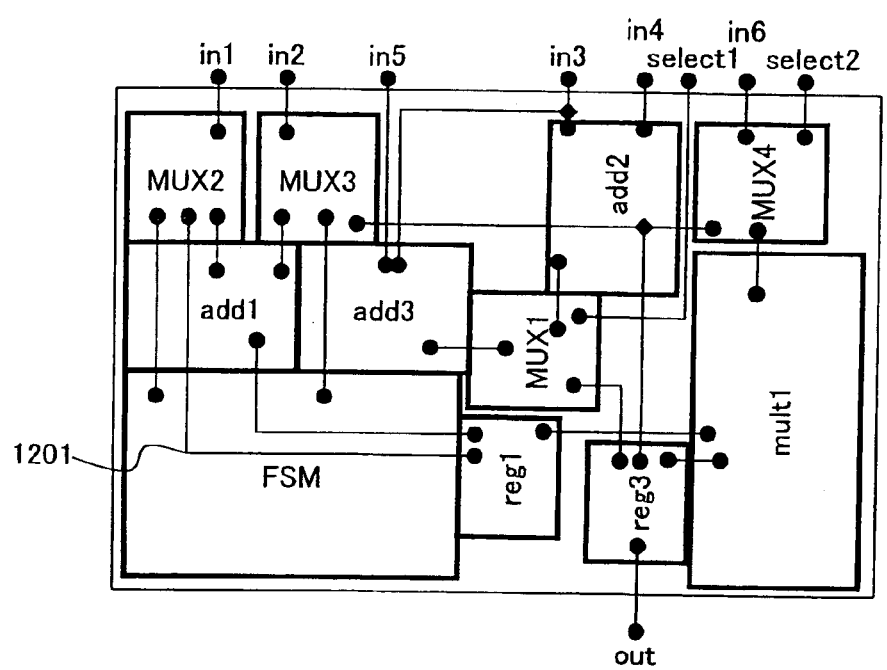
FIG. 26 is a view showing a digital circuit with a layout minutely corrected in resource-level layout minute correction according to the high-level synthesis method of Embodiment 3.

FIG. 26 shows a digital circuit with a layout minutely corrected in the resource-level layout minute correction according to the high-level synthesis method of Embodiment 3. FIG. 26 shows a result obtained by changing the allocation of resources so that the nodes m2 and m4 are allocated to the memory resource register reg3 in the resource sharing allocation (Step S1506) with respect to the digital circuit shown in FIG. 12, and minutely correcting the layout in the resource-level layout minute correction (Step S1507). The resource sharing allocation and circuit information generation is repeated as long as the design constraint is satisfied.

As described above, according to Embodiment 3, by sharing resources that have not been combined in the initial solution as much as possible with respect to the resources reallocated to separate resources after performing Embodiment 1, a circuit can be generated at a high level based on the layout result at a resource-level. Therefore, resources can be shared optimally in a range that does not contradict the design constraint after the layout.

Embodiment 4

Figure 27:
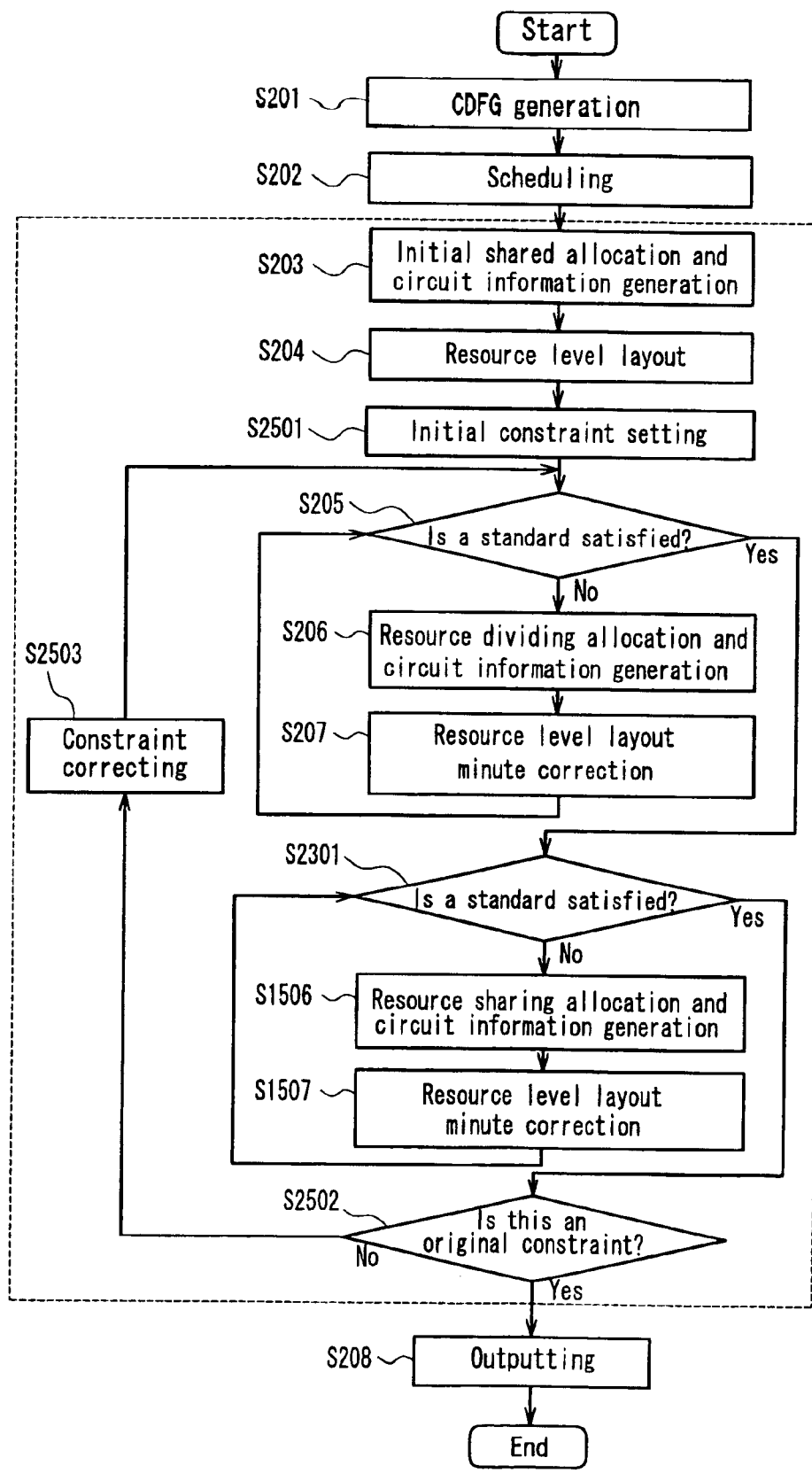
FIG. 27 is a flow chart showing a high-level synthesis method of Embodiment 4.
Figure 28:
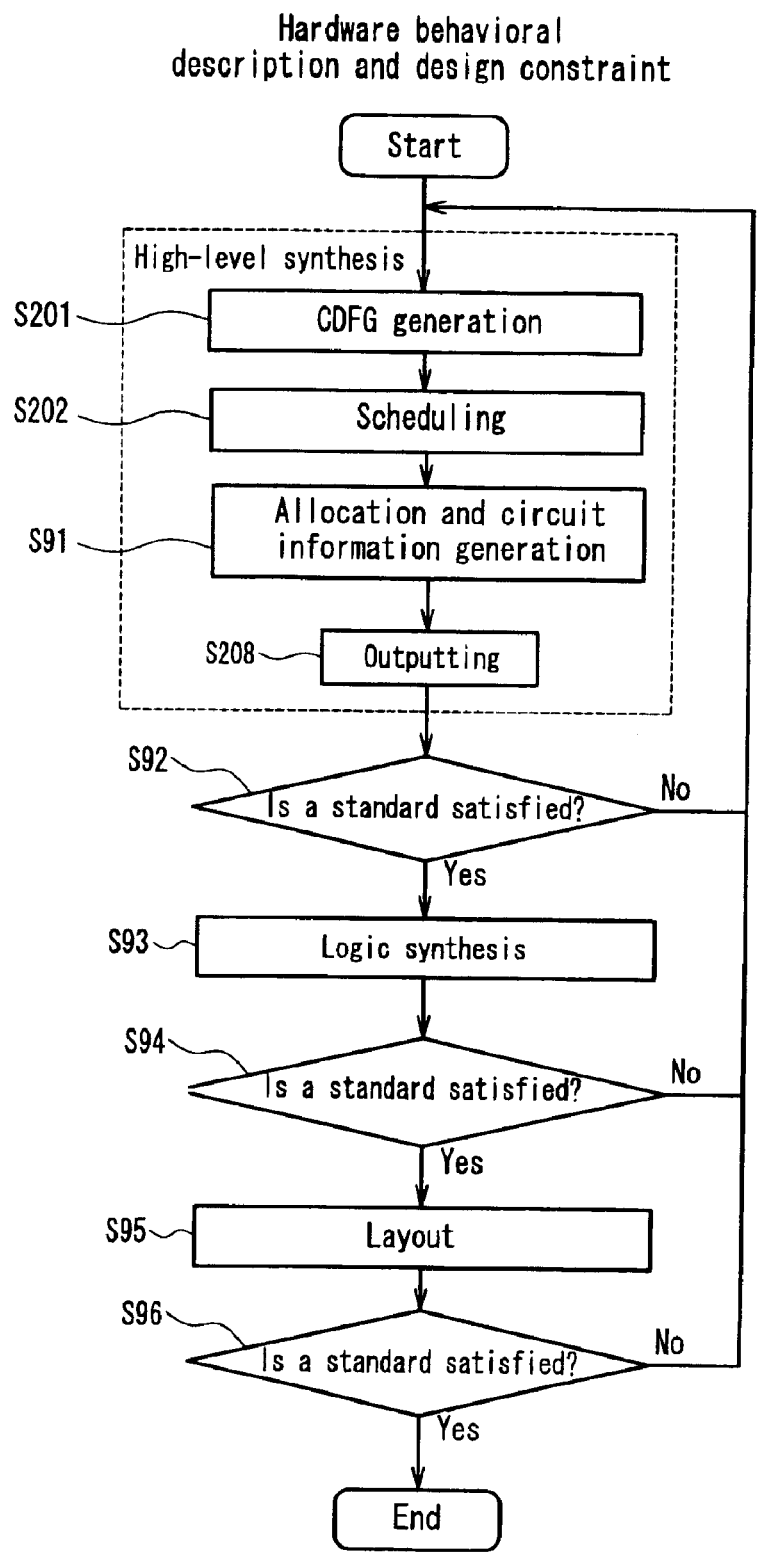
FIG. 28 is a flow chart showing a conventional high-level synthesis method.

FIG. 27 is a flow chart showing a high-level synthesis method of Embodiment 4. The same components as those in the flow chart showing the high-level synthesis method described with reference to FIGS. 1, 15, and 25 are denoted with the same reference numerals as those therein. Thus, the detailed description of these components will be omitted here.

The operations from the CDFG generation (Step S201) to the resource-level layout minute correction (Step S207) are the same as those in Embodiment 1 described with reference to FIG. 1. The resource sharing allocation and circuit information generation (Step S1506) and the resource-level layout minute correction (Step S1507) are the same as those in Embodiment 2 described with reference to FIG. 15. The determination whether or not there is a combination between hardware resources that can be shared based on the allocation information and have not been shared (Step S2301) is the same as that in Embodiment 3 described in FIG. 25.

In initial layout influence coefficient setting (Step S2501), a value smaller than an intended layout influence coefficient originally desired to be set is set as an initial layout influence coefficient representing the influence degree of resource-level layout information. For example, in the case where the value of the distance information of an inter-resource connecting line is used in determination (Step S205), the intended layout influence coefficient is 1.0, and the initial layout influence coefficient is set to be smaller than 1.0. The resource-level layout information is updated to a value obtained by multiplication with a value less than 1.0.

Then, until it is determined that the standard is satisfied in the determination (Step S205) based on the resource-level layout information considering the initial layout influence coefficient, the resource dividing allocation and circuit information generation (Step S206) and resource-level layout minute correction (Step S207) are repeated. The result of the resource-level layout information when it is determined that the standard is satisfied in the determination (Step S205) corresponds to the result in the case where the initial layout influence coefficient is satisfied. Therefore, although the constraint considering the original layout influence degree is not still satisfied, critical errors largely contradicting the constraint can be removed.

Thereafter, in the same way as in Embodiment 3, it is determined in the determination (Step S2301) whether or not there is a combination between hardware resources that can be shared based on the allocation information and have not been shared. When it is determined that there is a combination between hardware resources, combinations of resources are extracted, which can be shared in a range satisfying the design constraint even when the distance of an inter-resource connecting line becomes long or the congestion degree in a layout region is increased by sharing the resources (NO in Step S2301).

Then, the allocation of the resources is changed so that the resources are shared in the resource sharing allocation and circuit information generation (Step S1506). Then, the layout is minutely corrected in the resource-level layout minute correction (Step S1507).

When it is determined that there is no combination between hardware resources that can be shared and have not been shared (YES in Step S2301), it is determined whether or not the current layout influence coefficient is the intended layout influence coefficient to be given finally, in layout influence coefficient determination (Step S2502). When it is determined that the current layout influence coefficient is the intended layout influence coefficient to be given finally (YES in Step S2502), high-level synthesis processing is completed.

When it is determined that the current layout influence coefficient is not the intended layout influence coefficient to be given finally (NO in Step S2502), the current layout influence coefficient is corrected so as to be close to the intended layout influence coefficient in layout influence coefficient correction (Step S2503). Then, the process returns to Step S205.

Thus, Steps S205 to 2503 are repeated until the layout influence coefficient becomes the intended layout influence coefficient. The processing is performed in the order from rough layout information, whereby a field for searching for the allocation of resources contradicting the constraint in one process can be reduced. This enables high-level synthesis processing to be performed efficiently. Furthermore, the allocation of resources is repeated while the layout influence coefficient is changed. Therefore, a field of solution can be searched, in which the influence of the dependence on an initial solution is smaller than that in Embodiment 3 as described above.

Accordingly, the present invention is applicable to a high-level synthesis method for producing RTL circuit description for constituting a digital circuit.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high-level synthesis method, comprising:
    generating a CDFG (Control Data Flow Graph) based on an input file describing a behavior of a digital circuit;
    scheduling the CDFG by allocating each node of the CDFG generated in the CDFG generation, expressing contents of processing, to a time synchronized with a clock called a Step, based on the CDFG and a constraint condition of the digital circuit described in a constraint file;

generating initial allocation information representing how resources for constituting the digital circuit are allocated to respective nodes of the CDFG scheduled in the scheduling and initial circuit information representing a connecting relationship between the resources;

modifying the initial allocation and initial circuit information based on resource-level layout information representing a layout of the resources and outputting the circuit information modified in the allocation and circuit information modification.

2. The high-level synthesis method according to claim 1, wherein the allocation and circuit information modification comprises:

generating the resource-level layout information, based on the initial circuit information generated in the initial allocation and initial circuit information generation;

generating corrected allocation information representing how an allocation of the resources with respect to the respective nodes of the CDFG is changed and corrected circuit information representing how the connecting relationship between the resources is changed, based on the initial allocation information generated in the initial allocation and initial circuit information generation and the resource-level layout information; and minutely correcting the resource-level layout information, based on the corrected circuit information generated in the corrected allocation and corrected circuit information generation, wherein the corrected allocation and corrected circuit information generation, and the resource-level layout minute correction are performed repeatedly until a predetermined standard is satisfied, and in the corrected allocation and corrected circuit information generation, corrected allocation information representing how an allocation of the resources with respect to the respective nodes of the CDFG is changed and corrected circuit information how the connecting relationship between the resources is changed, are generated based on the resource-level layout information and the corrected allocation information previously generated.

3. The high-level synthesis method according to claim 2, wherein the allocation information contains hardware resource allocation information and lifetime information of hardware resources.

4. The high-level synthesis method according to claim 1, wherein the resource-level layout information is distance information of an inter-resource connecting line.

5. The high-level synthesis method according to claim 1, wherein the resource-level layout information is congestion degree information in a layout region of an inter-resource connecting line.

6. The high-level synthesis method according to claim 1, wherein the resource-level layout information is inter-macro connecting line information expressed by any function composed of distance information of an inter-resource connecting line and congestion degree information in a layout region of an inter-resouce connecting line.

7. The high-level synthesis method according to claim 1, wherein the resource level layout information includes a layout influence degree as a coeffcient.

8. The high-level synthesis method according to claim 2, wherein the resources are allocated to the respective nodes of the CDFG so as to minimize shared hardware resources in the initial allocation and initial circuit information generation, and an allocation of the resources with respect to the respective nodes of the CDFG is changed so that hardware resource separately implemented are shared in the corrected allocation and corrected circuit information generation.

9. The high-level synthesis method according to claim 2, wherein the resources are allocated to the respective nodes of the CDFG so as to maximize shared hardware resources in the initial allocation and initial circuit information generation, and shared hardware resources are allocated separately in the corrected allocation and corrected circuit information generation.

10. The high-level synthesis method according to claim 2, wherein, in the corrected allocation and corrected circuit information generation, an arrangement distribution variation in a layout region of memory resources is calculated, synthesis ease of a synchronization clock circuit is estimated based on the arrangement distribution variation in a layout region of the memory resources, and sharing with high synthesis ease is selected when the memory resources are shared.

11. The high-level synthesis method according to claim 10, wherein the arrangement distribution variation in the layout region of the memory resources is a variation in number of the memory resources belonging to each region obtained by dividing the layout region into a plurality of regions.

12. The high-level synthesis method according to claim 10, wherein the arrangement distribution variation in the layout region of the memory resources is a total of variations calculated for each hierarchy obtained by dividing the layout region hierarchically.

13. The high-level synthesis method according to claim 2, wherein the resources are allocated to the respective nodes of the CDFG so as to maximize shared hardware resources in the initial allocation and initial circuit information generation, the shared hardware resources are separately allocated in the corrected allocation and corrected circuit information generation, and the allocation and circuit information modification further includes changing the allocation by allowing the hardware resources divided in the corrected allocation and corrected circuit information generation to be shared with the hardware resources that are not shared in the initial allocation and initial circuit information generation.

14. The high-level synthesis method according to claim 13, wherein the resource-level layout information includes a layout influence degree as a layout influence coefficient, and the corrected allocation and corrected circuit information generation and the allocation changing are repeatedly performed while the layout influence coefficient is corrected in stages.

15. The high-level synthesis method according to claim 2, wherein the resource-level layout information minutely corrected in the resource-level layout minute correction is further output in the outputting.

* * * * *